United States Patent
Hong et al.

(10) Patent No.: US 12,495,573 B2
(45) Date of Patent: Dec. 9, 2025

(54) SEMICONDUCTOR DEVICE INCLUDING AIR GAP

(71) Applicant: SAMSUNG ELECTRONICS CO., LTD., Suwon-si (KR)

(72) Inventors: Sooyeon Hong, Yongin-si (KR); Deokhan Bae, Suwon-si (KR); Juhun Park, Seoul (KR); Yuri Lee, Hwaseong-si (KR); Yoonyoung Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 769 days.

(21) Appl. No.: 17/717,268

(22) Filed: Apr. 11, 2022

(65) Prior Publication Data
US 2023/0120532 A1    Apr. 20, 2023

(30) Foreign Application Priority Data
Oct. 15, 2021    (KR) .................. 10-2021-0137500

(51) Int. Cl.
*H10D 62/10* (2025.01)
*H10D 30/62* (2025.01)
*H10D 30/67* (2025.01)
*H10D 64/01* (2025.01)

(52) U.S. Cl.
CPC ..... *H10D 30/6219* (2025.01); *H10D 30/6211* (2025.01); *H10D 30/6729* (2025.01); *H10D 30/6735* (2025.01); *H10D 30/6757* (2025.01); *H10D 62/118* (2025.01); *H10D 64/01* (2025.01)

(58) Field of Classification Search
CPC ........... H10D 30/6219; H10D 30/6211; H10D 30/6757; H10D 64/01
See application file for complete search history.

(56) References Cited

U.S. PATENT DOCUMENTS

| | | | |
|---|---|---|---|
| 8,847,401 B2 | 9/2014 | Chen et al. | |
| 9,666,478 B2 | 5/2017 | Oszinda et al. | |
| 2015/0372102 A1* | 12/2015 | Usami | H10D 30/601 257/327 |
| 2016/0372415 A1* | 12/2016 | Siew | H01L 21/76264 |
| 2020/0006228 A1* | 1/2020 | Yang | H10D 84/038 |
| 2020/0020697 A1* | 1/2020 | Kim | H10B 12/0335 |
| 2020/0152761 A1 | 5/2020 | Cheng et al. | |
| 2021/0083067 A1* | 3/2021 | Wang | H10D 30/62 |

* cited by examiner

*Primary Examiner* — Sue A Purvis
*Assistant Examiner* — Seyon Ali-Simah Punchbeddell
(74) *Attorney, Agent, or Firm* — Morgan, Lewis & Bockius LLP

(57) ABSTRACT

A semiconductor device of the disclosure includes an active pattern extending on a substrate in a first direction, a gate structure extending on the active pattern in a second direction intersecting the first direction, a source/drain region disposed on at least one side of the gate structure, a source/drain contact connected to the source/drain region, and a contact insulating layer disposed on the source/drain contact. The contact insulating layer includes at least one air gap. The air gap is disposed on an upper surface of the source/drain contact.

20 Claims, 27 Drawing Sheets

SEMICONDUCTOR DEVICE INCLUDING AIR GAP

CROSS-REFERENCE TO RELATED APPLICATIONS

This application claims priority under 35 U.S.C. § 119 to Korean Patent Application No. 10-2021-0137500, filed on Oct. 15, 2021, in the Korean Intellectual Property Office, the disclosure of which is incorporated by reference herein in its entirety.

TECHNICAL FIELD

Embodiments of the present disclosure relate to a semiconductor device, and more specifically to a semiconductor device including an air gap and a manufacturing method thereof.

DISCUSSION OF RELATED ART

In accordance with a tendency of semiconductor devices toward miniaturization, technology associated with a fin field effect transistor (finFET) or a multi-bridge channel FET, which has a three-dimensional structure, has been introduced in order to reduce a short channel effect of a transistor, Meanwhile, in accordance with a reduction in device size, technology for forming contacts in a further-reduced region, and reducing capacitance among contacts is needed.

SUMMARY

At least one embodiment of the present disclosure provides a semiconductor device having enhanced reliability. At least one embodiment of the inventive concept provides a method manufacturing a semiconductor device having enhanced reliability.

According to at least one embodiment of the present disclosure, a semiconductor device is provided. The semiconductor device includes an active pattern extending on a substrate in a first direction, a gate structure extending on the active pattern in a second direction intersecting the first direction, a source/drain region disposed on at least one side of the gate structure, a source/drain contact connected to the source/drain region, and a contact insulating layer disposed on the source/drain contact. The contact insulating layer includes at least one air gap. The air gap is disposed on an upper surface of the source/drain contact.

According to at least one embodiment of the present disclosure, a semiconductor device is provided. The semiconductor device includes an active pattern extending on a substrate in a first direction. an element isolation layer covering a lower portion of the active pattern, a gate structure extending on the active pattern and the element isolation layer in a second direction intersecting the first direction, source/drain regions disposed at opposite sides of the gate structure, a first source/drain contact connected to the source/drain regions on one side of the gate structure, an interlayer insulating layer contacting the source/drain regions and the first source/drain contact, and a contact insulating layer disposed on the first source/drain contact. The contact insulating layer includes at least one air gap. The air gap is disposed on an upper surface of the first source/drain contact.

According to at least one embodiment of the present disclosure, a semiconductor device is provided. The semiconductor device includes an active pattern extending on a substrate in a first direction, an element isolation layer covering a lower portion of the active pattern, a gate structure intersecting the first direction on the active pattern and the element isolation layer, a gate contact connected to the gate structure, a source/drain region disposed on at least one side of the gate structure, a source/drain contact connected to the source/drain region on one side of the gate structure, an interlayer insulating layer contacting the source/drain region and the source/drain contact, and a contact insulating layer disposed on the source/drain contact. The contact insulating layer includes at least one air gap. The semiconductor device further includes a first wiring structure connected to the source/drain contact and a second wiring structure connected to the gate contact. The air gap is disposed on an upper surface of the source/drain contact.

BRIEF DESCRIPTION OF THE DRAWINGS

The above and other features of the present disclosure will become more apparent by describing in detail embodiments thereof with reference to the accompanying drawings, in which.

DETAILED DESCRIPTION

Embodiments of the present disclosure will be described more fully hereinafter with reference to the accompanying drawings.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of the embodiments.

As used herein, the singular forms "a," "an" and "the" are intended to include the plural forms as well, unless the context clearly indicates otherwise.

Herein, when one value is described as being about equal to another value or being substantially the same as or equal to another value, it is to be understood that the values are equal to each other to within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

Figure 1:
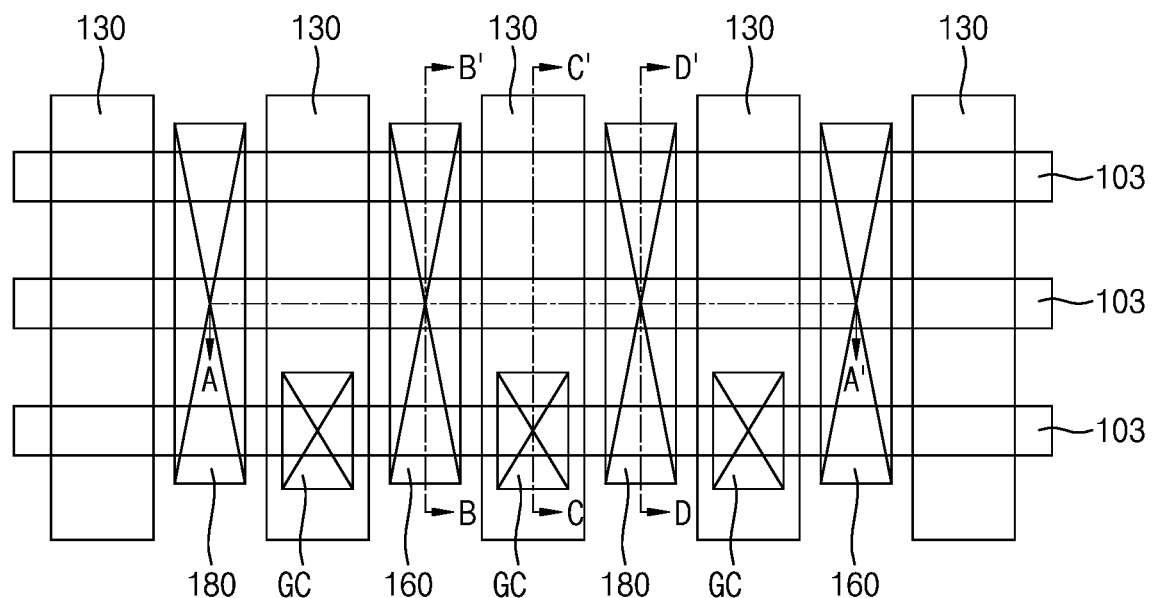
FIG. 1 is a schematic layout of a semiconductor device according to at least one embodiment of the present disclosure.
Figure 2:
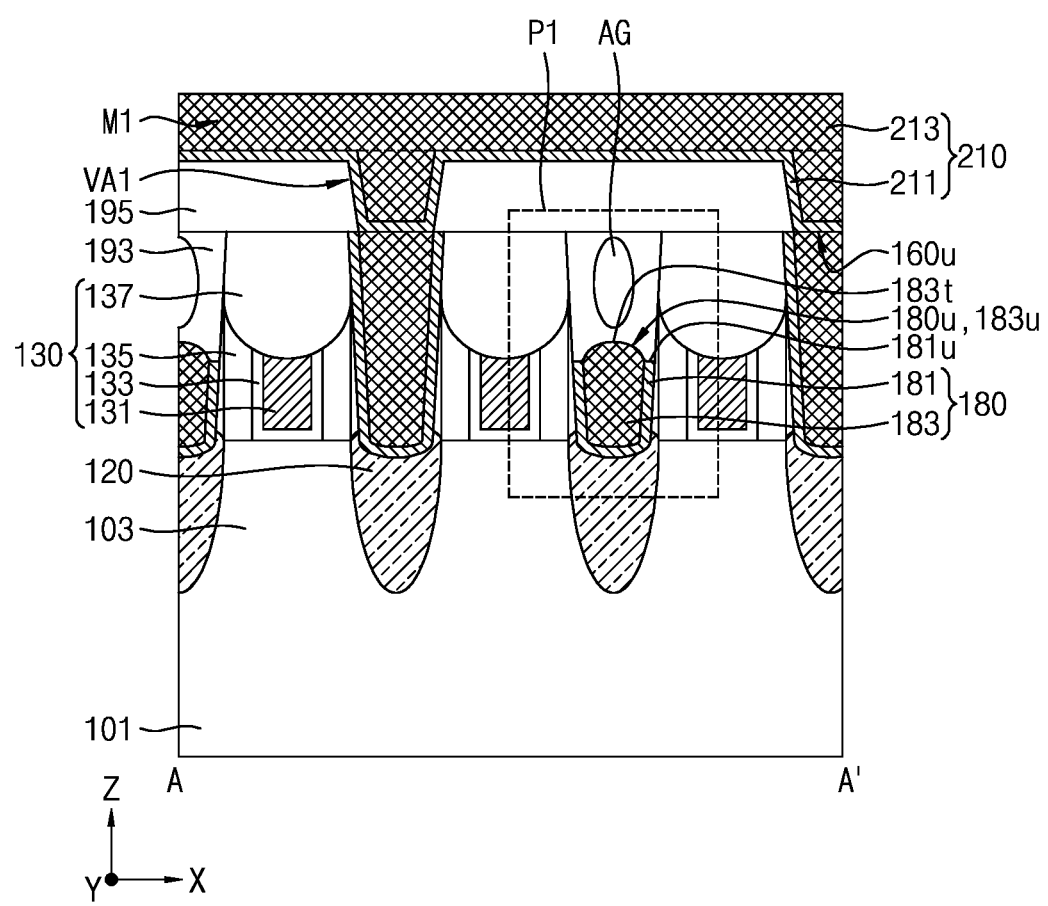
FIG. 2 is a cross-sectional view taken along line A-A' in FIG. 1.
Figure 3:
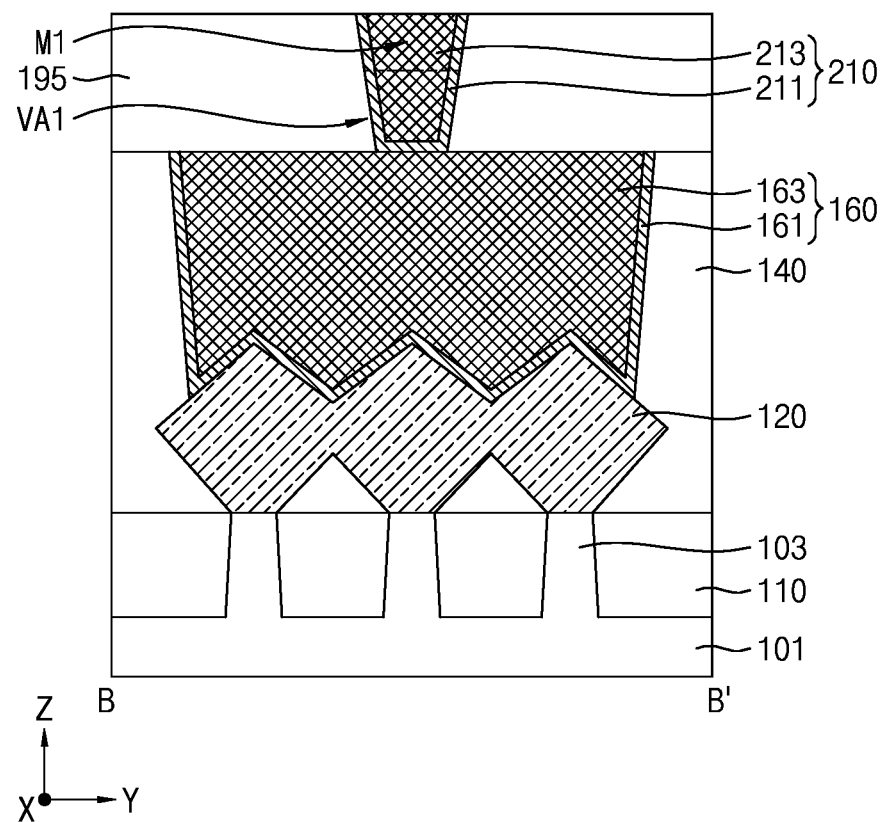
FIG. 3 is a cross-sectional view taken along line B-B' in FIG. 1.
Figure 4:
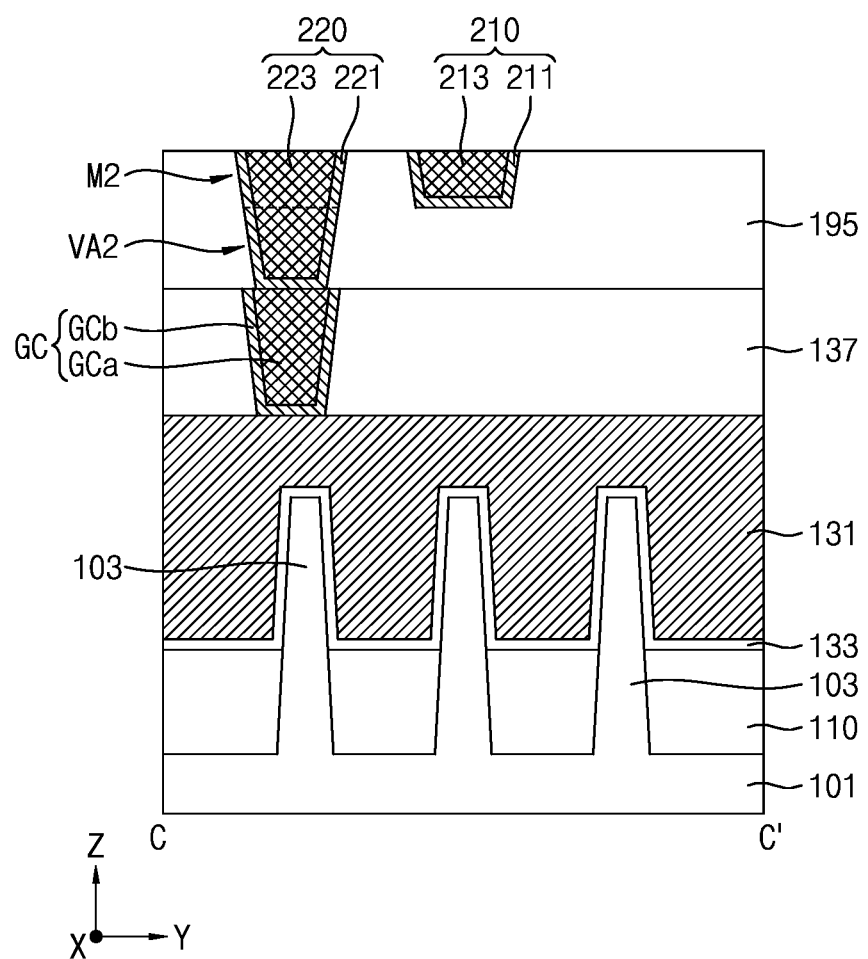
FIG. 4 is a cross-sectional view taken along line C-C' in FIG. 1.
Figure 5:
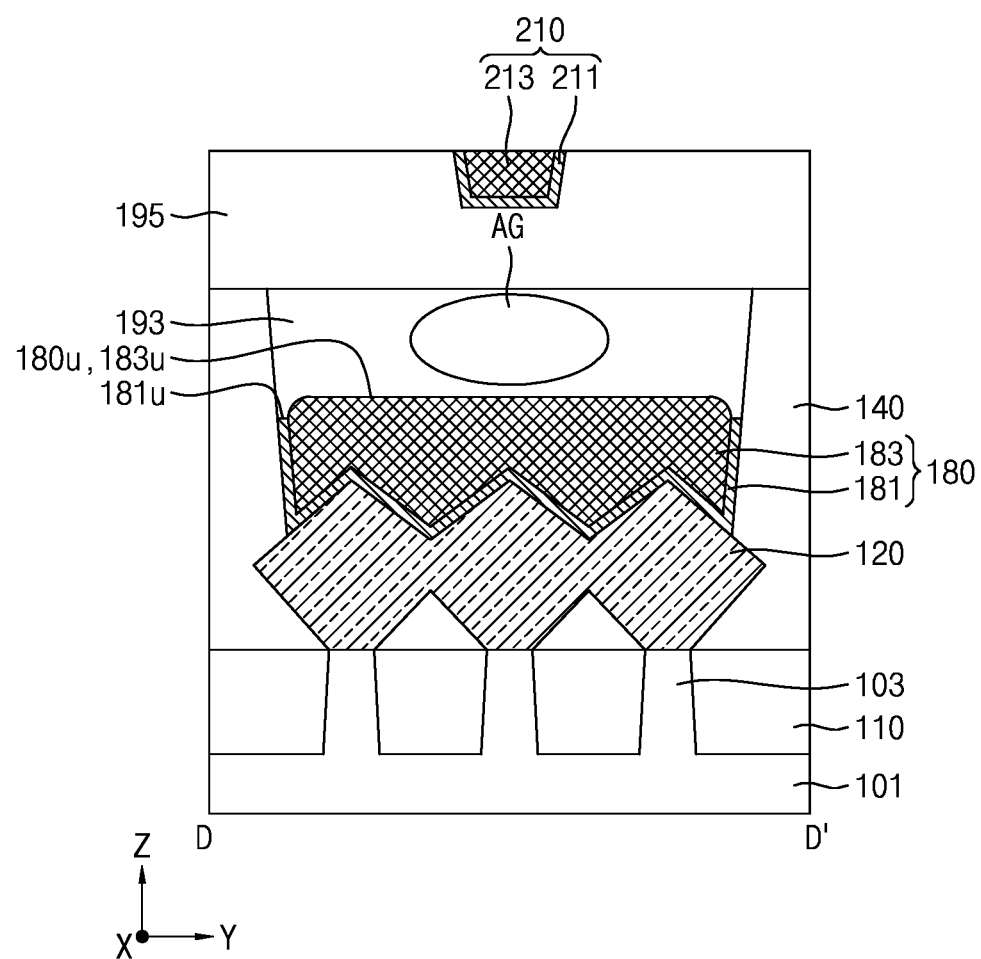
FIG. 5 is a cross-sectional view taken along line D-D' in FIG. 1.

FIG. 1 is a schematic layout of a semiconductor device according to at least one embodiment of the present disclosure. FIG. 2 is a cross-sectional view taken along line A-A' in FIG. 1. FIG. 3 is a cross-sectional view taken along line B-B' in FIG. 1. FIG. 4 is a cross-sectional view taken along line C-C' in FIG. 1. FIG. 5 is a cross-sectional view taken along line D-D' in Fla 1.

Referring to FIGS. 1 to 5, the semiconductor device may include a substrate 101, active patterns 103, an element isolation layer 110, gate structures 130, a gate contact GC, source/drain regions 120, source/drain contacts 160 and 180, a contact insulating layer 193, an interlayer insulating layer 140, an upper interlayer insulating layer 195, and wiring structures 210 and 220.

In at least one embodiment, the substrate 101 is a silicon substrate or a silicon-on-insulator (SOI) substrate. Alternatively, in at least one embodiment, the substrate 101 includes at least one of silicon germanium, silicon-germanium-on-insulator, indium antimonide, a lead telluride compound, indium arsenide, indium phosphide, gallium arsenide, or gallium antimonide. The substrate 101 may alternatively, or additionally, include other materials.

The active patterns 103 may be formed on the substrate 101. The active patterns 103 may extend on the substrate 101 in a first horizontal direction (e.g., an X direction). The active patterns 103 may be spaced apart from one another in a second horizontal direction (e.g., a Y direction perpendicular to the X direction). The active patterns 103 may protrude from an upper surface of the substrate 101 in a vertical direction (e.g., a Z direction perpendicular to the Y direction and the X direction). For example, the active patterns 103 may be fin-type patterns. Referring to FIG. 1, in at least one embodiment, the semiconductor device includes three active patterns 103. In at least one embodiment, and the semiconductor device includes one or more active patterns 103.

The active patterns 103 may include an epitaxial layer which may be a portion of the substrate 101 and may be grown from the substrate 101. For example, the active patterns 103 may include silicon or germanium. The active patterns 103 may include a compound semiconductor, and may include, for example, a group IV-IV compound semiconductor or a group III-V compound semiconductor.

The group IV-IV compound semiconductor may be a binary compound or a ternary compound including at least two of carbon (C), silicon (Si), germanium (Ge), and tin (Sn), or a compound in which the binary compound or the ternary compound is doped with a group IV element. The group III-V-compound semiconductor may be one of a binary compound, a ternary compound, and a quaternary compound each of which may be formed through coupling of at least one of aluminum (Al), gallium (Ga) and indium (In) (e.g., a group III element) with one of phosphorous (P), arsenide (As) and antimony (Sb) (e.g., a group V element).

The element isolation layer 110 may be disposed on the substrate 101. The element isolation layer 110 may at least partially cover the upper surface of the substrate 101 and may at least partially cover a portion of a sidewall of the active patterns 103. The active patterns 103 may protrude above the upper surface of the element isolation layer 110. The element isolation layer 110 may include oxide, nitride, oxynitride, or a combination thereof.

The gate structures 130 may extend in the second horizontal direction (e.g., the Y direction) that intersects the first horizontal direction (e.g., the X direction). The gate structures 130 may be spaced apart from one another in the first horizontal direction (e.g., the X direction). The gate structures 130 may be disposed on the element isolation layer 110 and the active patterns 103.

Referring to FIG. 2, each of the gate structures 130 may include a gate electrode 131, a gate insulating layer 133, a gate spacer 135, and a gate capping layer 137. The gate electrode 131 may extend in the second horizontal direction (e.g., the Y direction). The gate electrode 131 may be disposed on the active patterns 103. The gate electrode 131 may intersect the active pattern 103.

The gate electrode 131 may include at least one of titanium (Ti), a titanium compound, tantalum (Ta), or a tantalum compound. The gate electrode 131 may include at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), titanium aluminum (TiAl), titanium aluminum carbonitride (TiAlCN), titanium aluminum carbide (TiAlC), titanium carbide (TiC), tantalum carbonitride (TaCN), titanium (Ti), tantalum (Ta), or a combination thereof. The gate electrode 131 may include at least one of a conductive metal oxide, a conductive metal oxynitride, etc., or an oxidized form of the above-described material. In at least one embodiment, the gate electrode 131 includes a single layer. In at least one embodiment, the gate electrode 131 includes more than one layer.

The gate spacer 135 may be disposed on a sidewall of the gate electrode 131, The gate spacer 135 may extend in the second horizontal direction (e.g., the Y direction). The gate spacer 135 may include at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), or a combination thereof. In at least one embodiment, the gate spacer 135 includes a single layer. In at least one embodiment, the gate spacer 135 includes more than one layer.

The gate insulating layer 133 may be disposed on the active patterns 103 and the element isolation layer 110, The gate insulating layer 133 may be disposed between the gate electrode 131 and the gate spacer 135. The gate insulating layer 133 may extend along profiles (e.g., portions) of the active patterns 103 protruding above the element isolation layer 110 and an upper surface of the element isolation layer 110.

The gate insulating layer 133 may include at least one of silicon oxide, silicon oxynitride, silicon nitride, or one or more high-κ dielectrics having a higher dielectric constant than silicon oxide, such as hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The gate capping layer 137 may extend on the gate electrode 131, the gate insulating layer 133, and the gate spacer 135 in the second horizontal direction (e.g., the Y direction). The gate capping layer 137 may contact an upper surface of each of the gate electrode 131, the gate insulating layer 133, and the gate spacer 135. In at least one embodiment, the gate capping layer 137 is disposed on the gate electrode 131 and the gate insulating layer 133 between gate spacers 135, and the gate capping layer 137 is disposed on the gate electrode 131 between gate insulating layers 133.

The gate capping layer 137 may include at least one of silicon nitride (SiN), silicon oxynitride (SiON), silicon oxide (SiO$_2$), silicon carbonitride (SiCN), silicon oxycarbonitride (SiOCN), or a combination thereof.

Referring to FIG. 4, the gate contact GC may be disposed on the gate electrode 131. The gate contact GC may extend through the gate capping layer 137 in the vertical direction (e.g., the Z direction) and may connect to the gate electrode 131. The gate contact GC may vertically overlap at least one of the active patterns 103.

The gate contact GC may include a gate contact barrier layer GCb and a gate contact plug GCa disposed on the gate contact barrier layer GCb. The gate contact barrier layer GCb may surround a side surface and a bottom surface of the gate contact plug GCa. The gate contact barrier layer GCb may include at least one of ruthenium (Ru), titanium (Ti), titanium nitride (TN), tantalum (Ta), tantalum nitride (TaN), tungsten (W), titanium silicon nitride (TiSiN), titanium silicide (TiSi), or tungsten silicide (WSi). The gate contact plug GCa may include at Least one of cobalt (Co), tungsten (W), nickel (Ni), ruthenium (Ru), copper (Cu), aluminum (Al), a silicide thereof, or an alloy thereof.

Referring to FIG. 3, the source/drain regions 120 may be disposed on the active patterns 103. The source/drain regions 120 may be disposed on at least one side of a gate structure 130. The source/drain regions 120 may be disposed among the gate structures 130. The source/drain region 120 may include an epitaxial pattern. The source/drain regions 120 may be included in a source/drain of a transistor, where the active patterns 103 are implemented as a channel region of the transistor.

Referring to FIGS. 3 and 5 as, the source/drain regions 120 may include a structure in which three epitaxial patterns formed on respective active patterns 103 are joined together. In at least one embodiment, the source/drain regions 120 include one or more epitaxial patterns. In at least one embodiment, the epitaxial patterns formed on the active patterns 103 are spaced apart from one another.

Referring to FIGS. 3 and 5, the source/drain contacts 160 and 180 may be disposed among the gate structures 130. The source/drain contacts 160 and 180 may be disposed on the source/drain region 120. The source/drain contacts 160 and 180 may extend in the second horizontal direction (e.g., the Y direction). The source/drain contacts 160 and 180 may intersect the active patterns 103.

The source/drain contacts 160 and 180 may include a first source/drain contact 180 and a second source/drain contact 160. For example, the first source/drain contact 180 may be disposed on a first side of the gate structure 130, and the second source/drain contact 160 may be disposed on a second side of the gate structure 130. The first source/drain contact 180 and the second source/drain contact 160 may include different structures and may be differently shaped from each other. In at least one embodiment, the first source/drain contact 180 and the second source/drain contact 160 have different heights than each other.

Referring to FIGS. 2 and 5, an upper surface 180u of the first source/drain contact 180 may be disposed at a lower level than an upper surface of the gate structure 130. The upper surface 180u of the first source/drain contact 180 may be a curved surface. The upper surface 180u of the first source/drain contact 180 may be upwardly convex in the vertical direction (e.g., the Z direction).

The first source/drain contact 180 may include a first source/drain contact barrier layer 181 and a first source/drain contact plug 183. The first source/drain contact barrier layer 181 may be disposed along a side surface and a bottom surface of the first source/drain contact plug 183. An upper surface 183u of the first source/drain contact plug 183 may be a curved surface. The upper surface 183u of the first source/drain contact plug 183 may be upwardly convex in the vertical direction (e.g., the Z direction). An upper end 183t of the first source/drain contact plug 183 may be disposed at a higher level in the vertical direction than an upper end 181u of the first source/drain contact barrier layer 181.

An upper surface 160u of the second source/drain contact 160 may be disposed at a higher level than the upper surface 180u of the first source/drain contact 180. The upper surface 160u of the second source/drain contact 160 may be disposed at the same level as the upper surface of the gate structure 130. The upper surface 160u of the second source/drain contact 160 may be coplanar with the upper surface of the gate structure 130. The second source/drain contact 160 may include a second source/drain contact barrier layer 161 and a second source/drain contact plug 163.

The first source/drain contact barrier layer 181 and the second source/drain contact barrier layer 161 may include at least one of ruthenium (Ru), titanium (Ti), titanium nitride (TIN), tantalum (Ta), tantalum nitride (TaN), tungsten (W), titanium silicon nitride (TiSiN), titanium silicide (TiSi), or tungsten silicide (WSi). The first source/drain contact plug 183 and the second source/drain contact plug 163 may include at least one of cobalt (Co), tungsten (W), nickel (Ni), ruthenium (Ru), copper (Cu), aluminum (Al), a silicide thereof, or an alloy thereof.

The contact insulating layer 193 may be disposed between proximate pairs of the gate structures 130. The contact insulating layer 193 may be disposed on the first source/drain contact 180. The contact insulating layer 193 may be spaced apart from the source/drain region 120. The contact insulating layer 193 may at least partially cover the upper surface 180u of the first source/drain contact 180. The contact insulating layer 193 may extend in the second horizontal direction (e.g., the Y direction). A bottom surface of the contact insulating layer 193 may be a curved surface. The bottom surface of the contact insulating layer 193 may be upwardly concave in the vertical direction (e.g., the Z direction). The upper surface 180u of the first source/drain contact 180 may be upwardly convex in the vertical direction toward the contact insulating layer 193, and the bottom surface of the contact insulating layer 193 may have a shape corresponding to that of the upper surface 180u of the first source/drain contact 180. The contact insulating layer 193 may include silicon oxycarbide (SiOC).

Referring to FIGS. 2 and 5, an air gap AG may be formed in the contact insulating layer 193. For example, the contact insulating layer 193 may surround the air gap AG. In at least one embodiment, the air gap AG is a vacuum, and has a permittivity of 1. In at least one embodiment, the air gap AG is a space filled with air, and has a permittivity of about 1.. The air gap AG may be disposed on the upper surface 180u of the first source/drain contact 180. The air gap AG may be vertically spaced apart from the first source/drain contact 180, For example, the contact insulating layer 193 may be disposed between the air gap AG and the upper surface 180u of the first source/drain contact 180. The air gap AG may be disposed between proximate pairs of the gate structures 130. In at least one embodiment, a lower end of the air gap AG may be disposed at a higher level than a lower end of the gate capping layer 137. For example, a lower portion of a surface of the contact insulating layer 193 terminating adjacent to the air gap AG may be disposed at a higher level than the lower end of the gate capping layer 137. The air gap AG may minimize parasitic capacitance that may be generated by gate contacts GC disposed adjacent to the contact insulating layer 193 and connected to the gate structure 130.

Referring to EEGs. 3 and 5, the interlayer insulating layer 140 may be disposed on the element isolation layer 110. The interlayer insulating layer 140 may cover a sidewall of the source/drain region 120, a sidewall of the first source/drain contact 180, and a sidewall of the second source/drain contact 160. The interlayer insulating layer 140 may cover a sidewall of the contact insulating layer 193.

The interlayer insulating layer 140 may include at least one of silicon oxide, silicon nitride, silicon oxynitride, or one or more low-K dielectrics such as fluorinated tetraethylorthosilicate (FTEOS), hydrogen silsesquioxane (HSQ), bis-benzocyclobutene (BCB), tetramethyl orthosilicate (TMOS), octamethylcyclotetrasiloxane (OMCTS), hexamethyldisiloxane (HMDS), trimethylsilyl borate (TMSB), diacetoxydi-tert-butoxysilane (DADBS), trimethylsilyl phosphate (TMSP), polytetrafluoroethylene (PTFE), Tonen silazane (TOSZ), fluoride silicate glass (FSG), polyimide nanofoams such as polypropylene oxide, carbon doped silicon oxide (CDO), organosilicate glass (OSG), SILK, amorphous fluorinated carbon, silica aerogels, silica xerogels, mesoporous silica, or a combination thereof. The interlayer insulating layer 140 may alternatively or additionally include other materials.

Referring to FIGS. 2 and 5, the upper interlayer insulating layer 195 may be disposed on the gate structure 130, the contact insulating layer 193, and the interlayer insulating layer 140. The upper interlayer insulating layer 195 may cover an upper surface of each of the gate structure 130, the contact insulating layer 193, and the interlayer insulating layer 140. The upper interlayer insulating layer 195 may cover an upper surface of the second source/drain contact 160. For example, the upper interlayer insulting layer 195 may include at least one of silicon oxide, silicon nitride, silicon oxynitride, or one or more low-K dielectrics.

Referring to FIGS. 2-5, the wiring structures 210 and 220 may be disposed on the interlayer insulating layer 140. The wiring structures 210 and 220 may include a first wiring structure 210 and a second wiring structure 220. The first wiring structure 210 may be electrically connected to the second source/drain contact 160. The first wiring structure 210 may be directly connected to the second source/drain contact 160. The first wiring structure 210 may include a first via VA1 and a first wiring pattern M1. The first via VA1 may extend through the upper interlayer insulating layer 195 and the contact insulating layer 193 and directly connect to the second source/drain contact 160. The first via VA1 may interconnect the first wiring pattern M1 and the second source/drain contact 160. The first wiring pattern M1 may be disposed on the first via VA1. Each of the first via VA1 and the first wiring pattern M1 may include a first wiring barrier layer 211 and a first wiring filling layer 213.

The second wiring structure 220 may be disposed on the gate contact GC. The second wiring structure 220 may include a second wiring barrier layer 221 and a second wiring filling layer 223. Each of the first wiring barrier layer 211 and the second wiring barrier layer 221 may include at least one of tantalum (Ta), tantalum nitride (TaN), titanium (Ti), titanium nitride (Till, ruthenium (Ru), cobalt (Co), nickel (Ni), nickel boron (NiB), tungsten (W), tungsten nitride (WN), zirconium (Zr), zirconium nitride (ZrN), vanadium (V), vanadium nitride (\'N), niobium (Nb), niobium nitride (NbN), platinum (Pt), iridium (Ir), or rhodium (Rh). Each of the first wiring filling layer 213 and the second wiring filling layer 223 may include at least one of aluminum (Al), copper (Cu), tungsten (W), cobalt (Co), ruthenium (Ru), or molybdenum (Mo).

Figure 6:
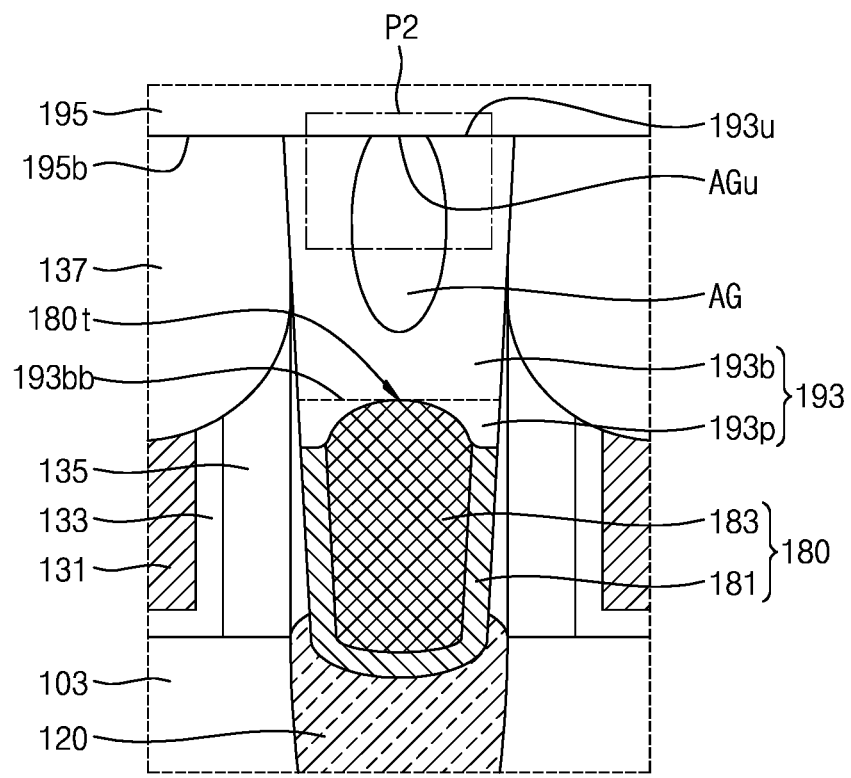
FIG. 6 is an enlarged view showing a region corresponding to a region P1 of FIG. 2 in a semiconductor device according to at least one embodiment of the present disclosure.

FIG. 6 is an enlarged view showing a region corresponding to a region P1 of FIG. 2 in a semiconductor device according to at least one embodiment of the present disclosure.

Referring to FIG. 6, an air gap AG may partially expose a bottom surface 195b of an upper interlayer insulating layer 195. For example, a portion of the bottom surface 195b disposed above an upper portion AGu of the air gap AG may be exposed. The upper perimeter AGu of the air gap AG may be immediately adjacent to the bottom surface 195b of the upper interlayer insulating layer 195. The upper perimeter AGu or an upper end of the air gap AG may be disposed at the same level as an upper surface 193u of a contact insulating layer 193. For example, a portion of the upper surface 193u may terminate immediately adjacent to the upper perimeter AGu.

The contact insulating layer 193 may include a base 193b and a protrusion 193p. The air gap AG may be formed in the base 193b. The protrusion 193p may extend from a bottom surface 193bb of the base 193b toward the substrate 101. The protrusion 193p may downwardly extend in the vertical direction (e.g., the Z direction) to a lower level than an upper end 180t of a first source/drain contact 180. The protrusion 193p may have a width gradually decreasing in the first horizontal direction (the X direction) as the protrusion 193p extends away from the base 193b.

Figure 7:
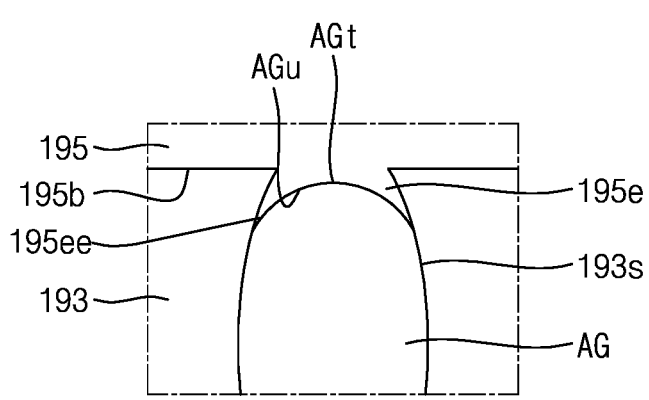
FIG. 7 is an enlarged view showing a region corresponding to a region P2 of FIG. 6 in a semiconductor device according to at least one embodiment of the present disclosure.

FIG. 7 is an enlarged view showing a region corresponding to a region P2 of FIG. 6 in a semiconductor device according to at least one embodiment of the present disclosure.

Referring to FIG. 7, an upper interlayer insulating layer 195 may include an extension 195e extending from a bottom surface 195b of the upper interlayer insulating layer 195 into a contact insulating layer 193. The extension 195e may extend along an upper portion of an inner side surface 193s of the contact insulating layer 193 immediately adjacent to the air gap AG. For example, the air gap AG may terminate adjacent to the inner side surface 193s and the extension 195e, and the air gap AG may expose the side surface 193s and the extension 195e. The extension 195e may be disposed above the air gap AG. An upper perimeter AGu of the air gap AG may be immediately adjacent to the extension 195e. A lower surface of the extension 195e may correspond to the upper perimeter AGu of the air gap AG. For example, the lower surface of the extension 195e may contact and/or be disposed immediately adjacent to the upper perimeter AGu. The lower surface of the extension 195e may be a curved surface, and may be concave in a direction opposite to a substrate 101. For example, the lower surface of the extension 195e may curve away from the substrate 101 in the vertical direction (e.g., the Z direction). A lower end 195ee of the extension 195e may be disposed at a lower level than an upper end AGt of the air gap AG. For example, the upper end AGt may contact an apex of a curve of the extension 195e at a first level, and the lower end 195ee may be disposed at a second level that is lower in the vertical direction (e.g., the Z direction) than the first level.

Figure 8:
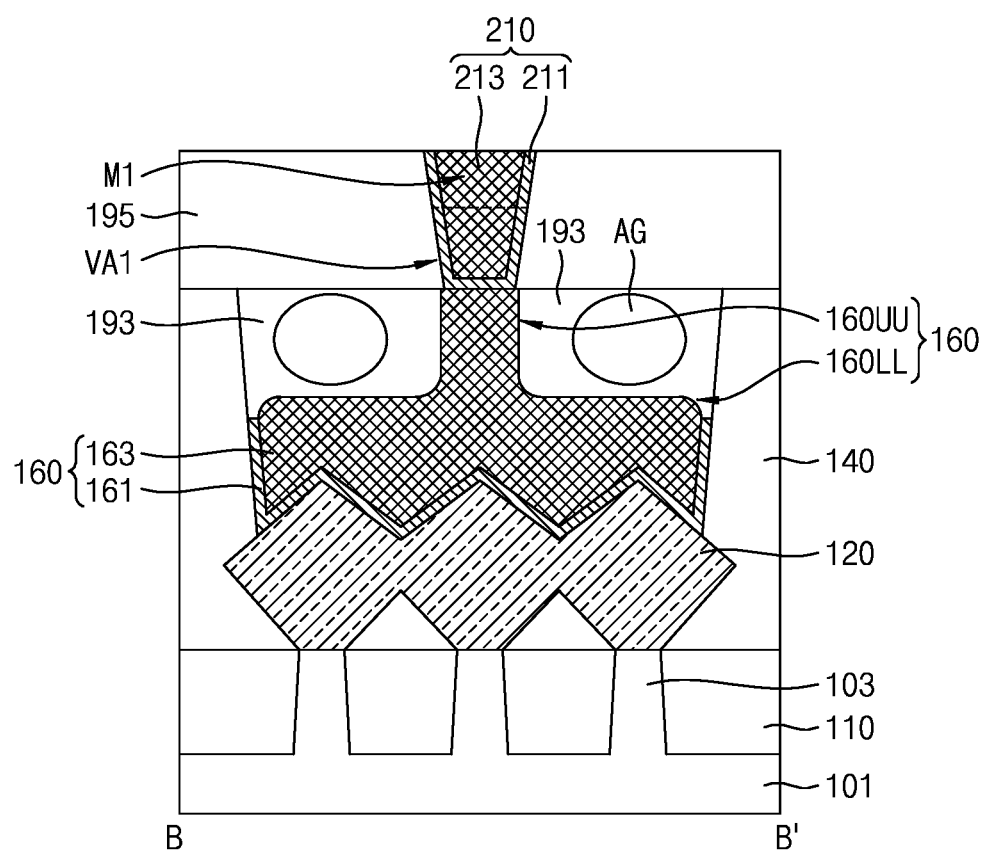
FIG. 8 is a cross-sectional view taken along line B-B' in FIG. 1 according to at least one embodiment of the present disclosure.

FIG. 8 is a cross-sectional view taken along line B-B' in FIG. 1 in accordance with an embodiment.

Referring to FIG. 8, the second source/drain contact 160 may include a lower contact 160LL and an upper contact 160UU. The lower contact 160LL may be directly connected to the source/drain region 120, and the upper contact 160UU may protrude from an upper surface of the lower contact 160LL. The contact insulating layer 193 and air gaps AG may be disposed on the lower contact 160LL. The air gaps AG may be disposed on opposite sides of the upper contact 160UU. For example, the air gaps AG may be disposed adjacent to the upper contact 160UU, and the upper contact 160UU may be disposed between the air gaps AG. The first wiring structure 210 may be disposed on the upper contact 160UU. The first wiring structure 210 may be directly connected to the upper contact 160UU. The first wiring structure 210 and the lower contact 160LL may be electrically interconnected by the upper contact 160UU.

Figure 9:
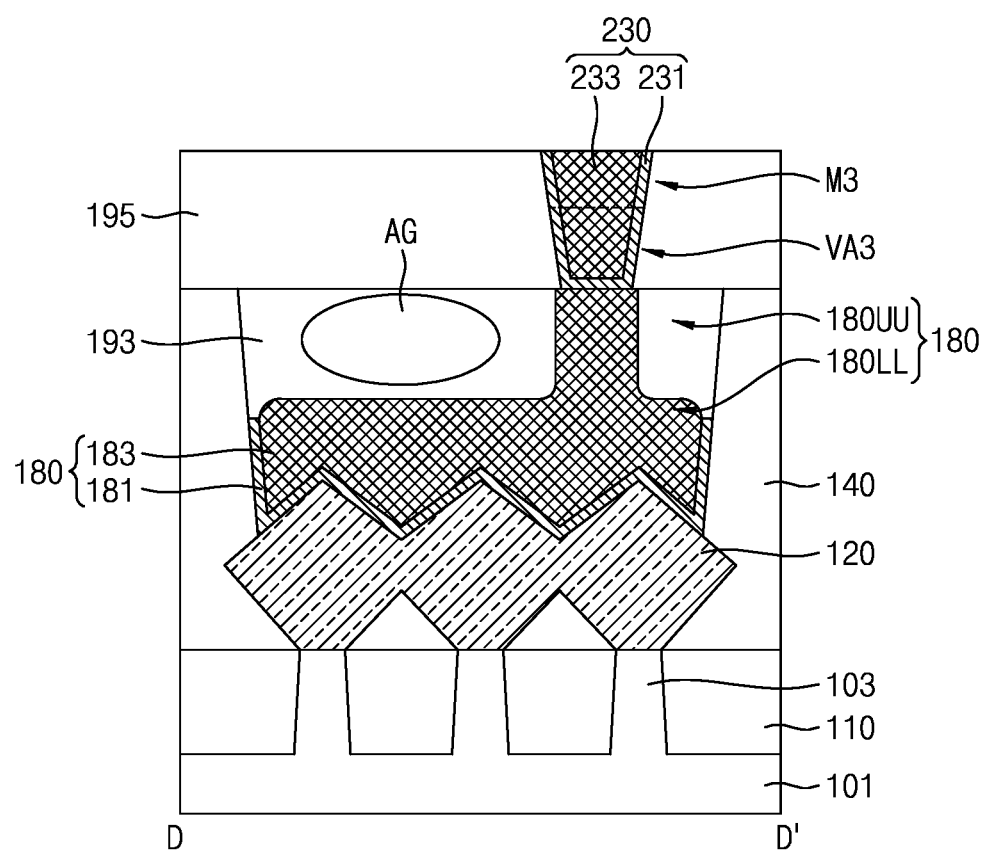
FIG. 9 is a cross-sectional view taken along line D-D' in FIG. 1 according to at least one embodiment of the present disclosure.

FIG. 9 is a cross-sectional view taken along line D-D' in FIG. 1 in accordance with an embodiment.

Referring to FIG. 9, the first source/drain contact 180 may include a lower contact 180LL and an upper contact 180UU. The lower contact 180LL may be directly connected to the source; drain region 120, and the upper contact 180UU may protrude from an upper surface of the lower contact 180LL. The contact insulating layer 193 and an air gap AG may be disposed on the lower contact 180LL, The air gap AG may be disposed on one side of the upper contact 180UU. For example, the air gap AG may be disposed adjacent to the one side of the upper contact 180UU. A third wiring structure 230 may be disposed on the upper contact 180UU. The third wiring structure 230 may be directly connected to the upper contact 180UU. The third wiring structure 230 and the lower contact 180LL may be electrically interconnected by the upper contact 180UU. The third wiring structure 230 may include a third via VA3 and a third wiring pattern M3. The third via VA3 may be directly connected to the upper contact 180UU. The third wiring pattern M3 and the upper contact 180UU may be electrically interconnected via the third via VA3. Each of the third via VA3 and the third wiring pattern M3 may include a third wiring barrier layer 231 and a third wiring filling layer 233.

FIGS. 10 to 22 are cross-sectional views showing a semiconductor device manufacturing method according to at least one embodiment of the present disclosure. In FIGS. 10 to 22, cross-sections taken along lines A-A', B-B' and D-D' in FIG. 1 are shown in accordance with a process sequence.

Figure 10:
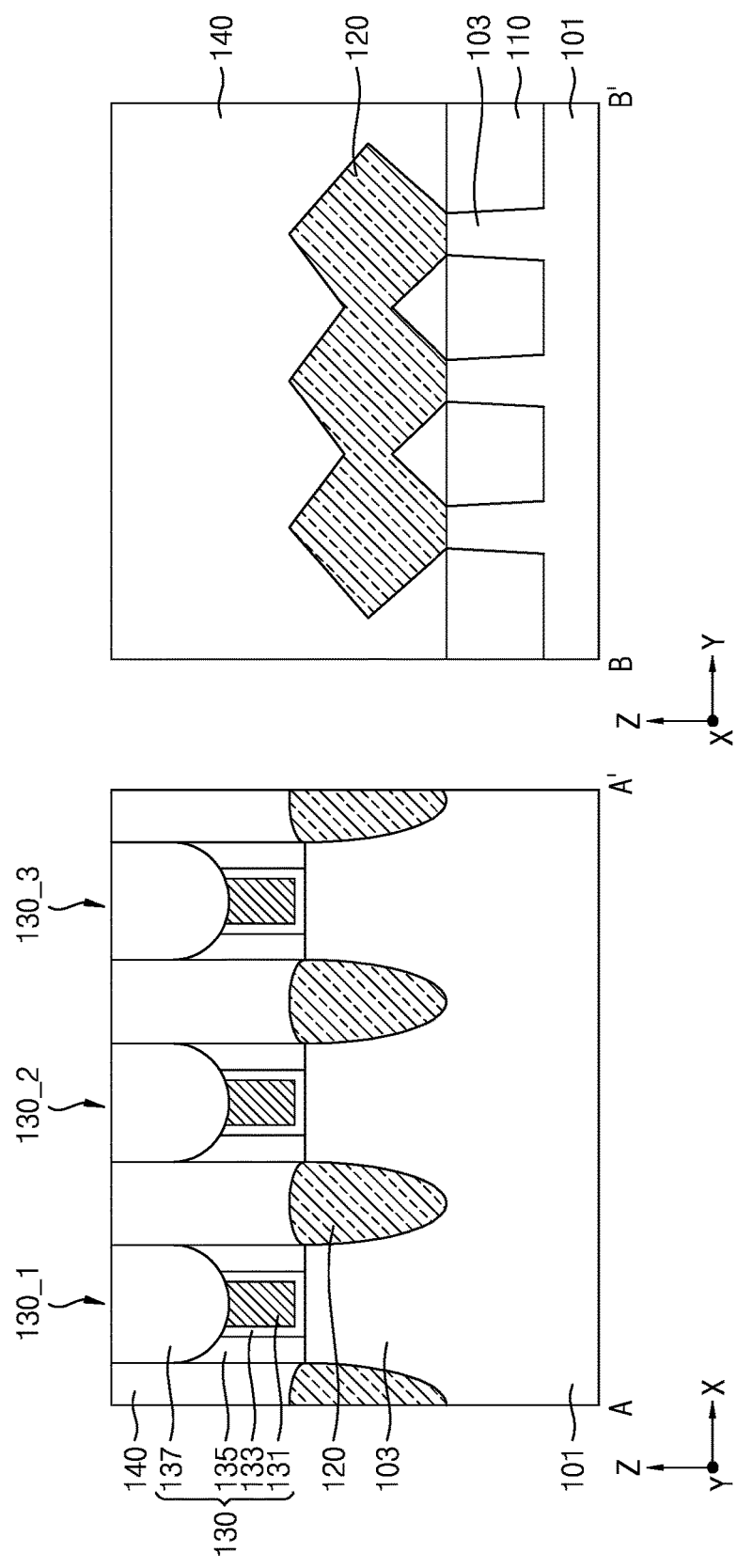
FIGS. 10 to 22 are cross-sectional views showing a semiconductor device manufacturing method according to at least one embodiment of the present disclosure.

Referring to FIG. 10, a region of a substrate 101 may be etched, thereby forming an active pattern 103. The active pattern 103 may be a fin-type active pattern having the form of a fin protruding from an upper surface of the substrate 101 in a vertical direction (e.g., a Z direction) and extending in a first horizontal direction (e.g., an X direction perpendicular to the Z direction). An element isolation layer 110 covering lower portions of opposite sidewalls of the active pattern 103 may be formed on the substrate 101.

A sacrificial gate structure including a sacrificial gate insulating pattern, a sacrificial gate, and a sacrificial capping pattern may be formed on the substrate 101, and a gate spacer 135 may be formed on a sidewall of the sacrificial gate structure. The sacrificial gate structure and the gate spacer 135 may expose a portion of the active pattern 103.

The active pattern 103 may be partially etched on opposite sides of the sacrificial gate structure and the gate spacer 135, thereby forming a recess region. For example, the active pattern 103 may be partially etched between proximate pairs of the sacrificial gate structure. In at least one embodiment, the recess region is formed through a dry etching process, a wet etching process, or a combination thereof.

A source/drain region 120 may be formed in the recess region. The source/drain region 120 may be formed using an upper surface and a sidewall of the active pattern 103 exposed by the recess region as a seed layer. The source/drain region 120 may be formed by an epitaxial process.

An insulating layer covering the sacrificial gate structure, the gate spacer 135, and the source/drain region 120 may be formed on the substrate 101, and the insulating layer may be planarized until upper surfaces of the sacrificial gate structure and the gate spacer 135 are exposed, thereby forming an interlayer insulating layer 140.

After removal of the sacrificial gate structure, a gate insulating layer 133 may be formed on inner sidewalls of a pair of gate spacers 135, the active pattern 103, and the element isolation layer 110 (cf. FIG. 4). A conductive layer filling a space between the pair of gate spacers 135 may be formed on the gate insulating layer 133, and an upper portion of the conductive layer may then be removed, thereby forming a gate electrode 131. When the upper portion of the conductive layer is removed, upper portions of the gate spacer 135 and the gate insulating layer 133 may also be removed.

An insulating layer may be formed on the gate electrode 131, the gate insulating layer 133, and the gate spacer 135, and an upper portion of the insulating layer may then be removed until an upper surface of the interlayer insulating layer 140 is exposed, thereby forming a gate capping layer 137. As a result, a plurality of gate structures 130may be formed. At least one gate structure of the plurality of gate structures may include the gate insulating layer 133, the gate electrode 131, the gate spacer 135 and the gate capping layer 137. The plurality of gate structures 130 may be sequentially disposed in the first horizontal direction (e.g., the X direction), and may include first to third gate structures 134_1, 130_2, and 130_3 spaced apart from one another.

Figure 11:
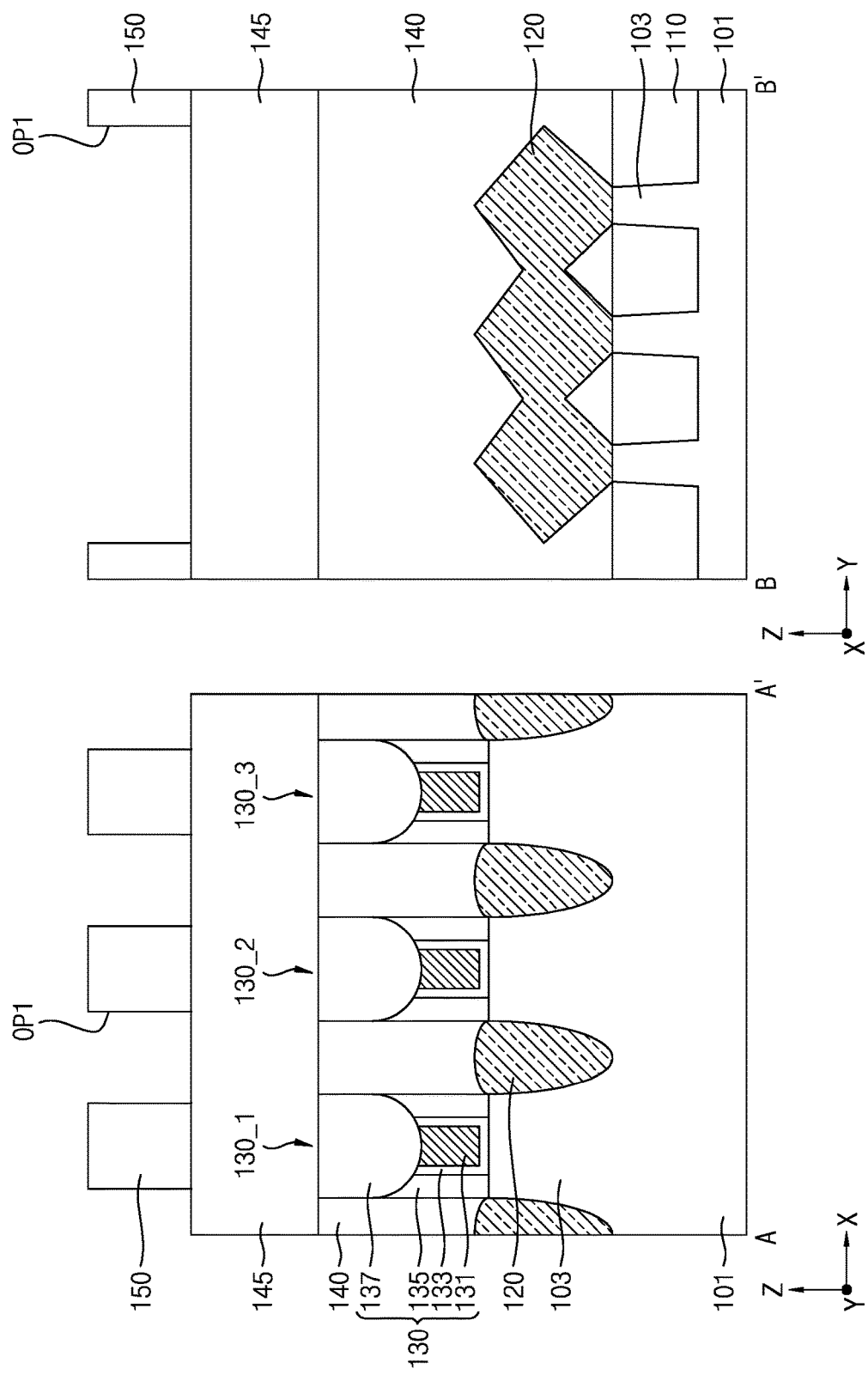

Referring to FIG. 11, a first sacrificial interlayer insulating layer 145 may be formed on the gate structures 130 and the interlayer insulating layer 140. A first mask pattern 150 including a plurality of first openings OP1 may be formed on the first sacrificial interlayer insulating layer 145. For example, the plurality of first openings OP1 may be formed at a position overlapping with the source/drain region 120. For example, each first openings OP1 may be respectively formed above a source/drain region 120. The first sacrificial interlayer insulating layer 145 may include at least one of silicon oxide, silicon oxynitride, or one or more low-κ dielectrics.

Figure 12:
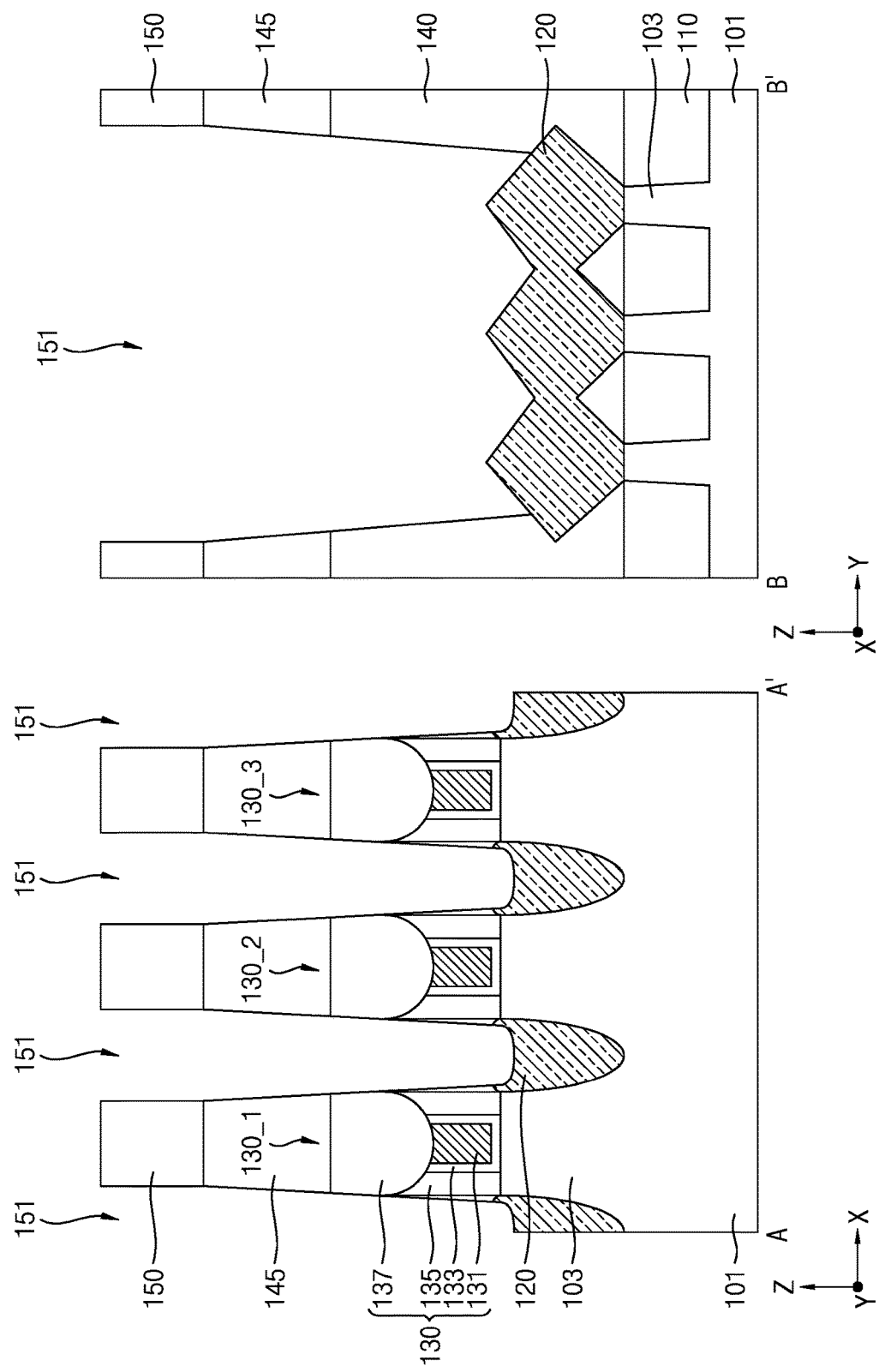

Referring to FIG. 12, the first sacrificial interlayer insulating layer 145 and the interlayer insulating layer 140 may be removed through an etching process using the first mask pattern 150 as an etch mask, thereby forming contact holes 151. The contact holes 151 may be formed among the gate structures 130. For example, a contact hole 151 may be respectively formed between proximate pairs of the gate structures 130. The source/drain region 120 may be exposed by the contact holes 151.

Figure 13:
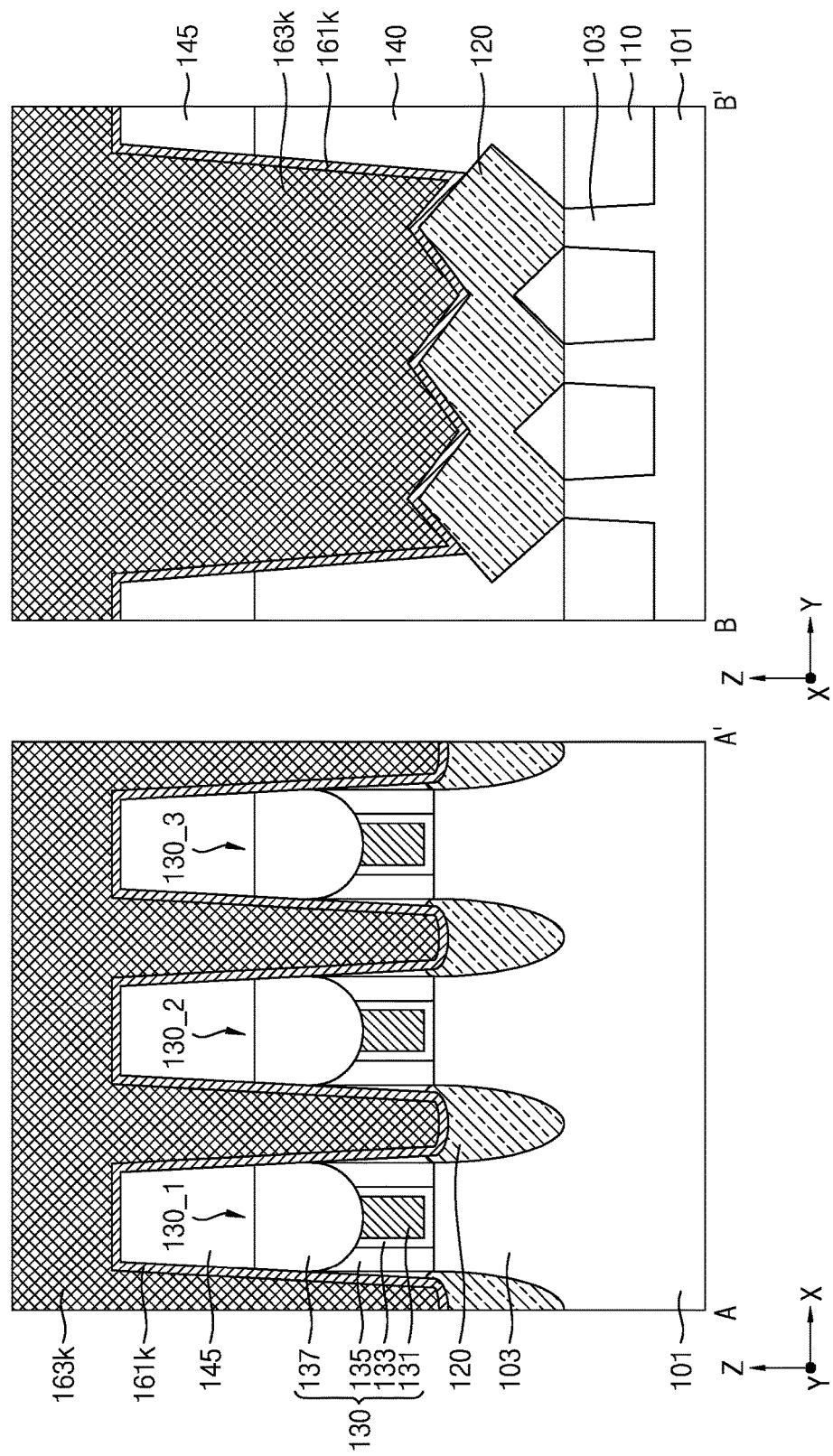

Referring to FIG. 13, the first mask pattern 150 may be removed, thereby exposing an upper surface of the first sacrificial interlayer insulating layer 145. Thereafter, a preliminary barrier layer 161k and a buried conductive layer 163k may be sequentially formed in the contact holes 151 and the first sacrificial interlayer insulating layer 145.

Figure 14:
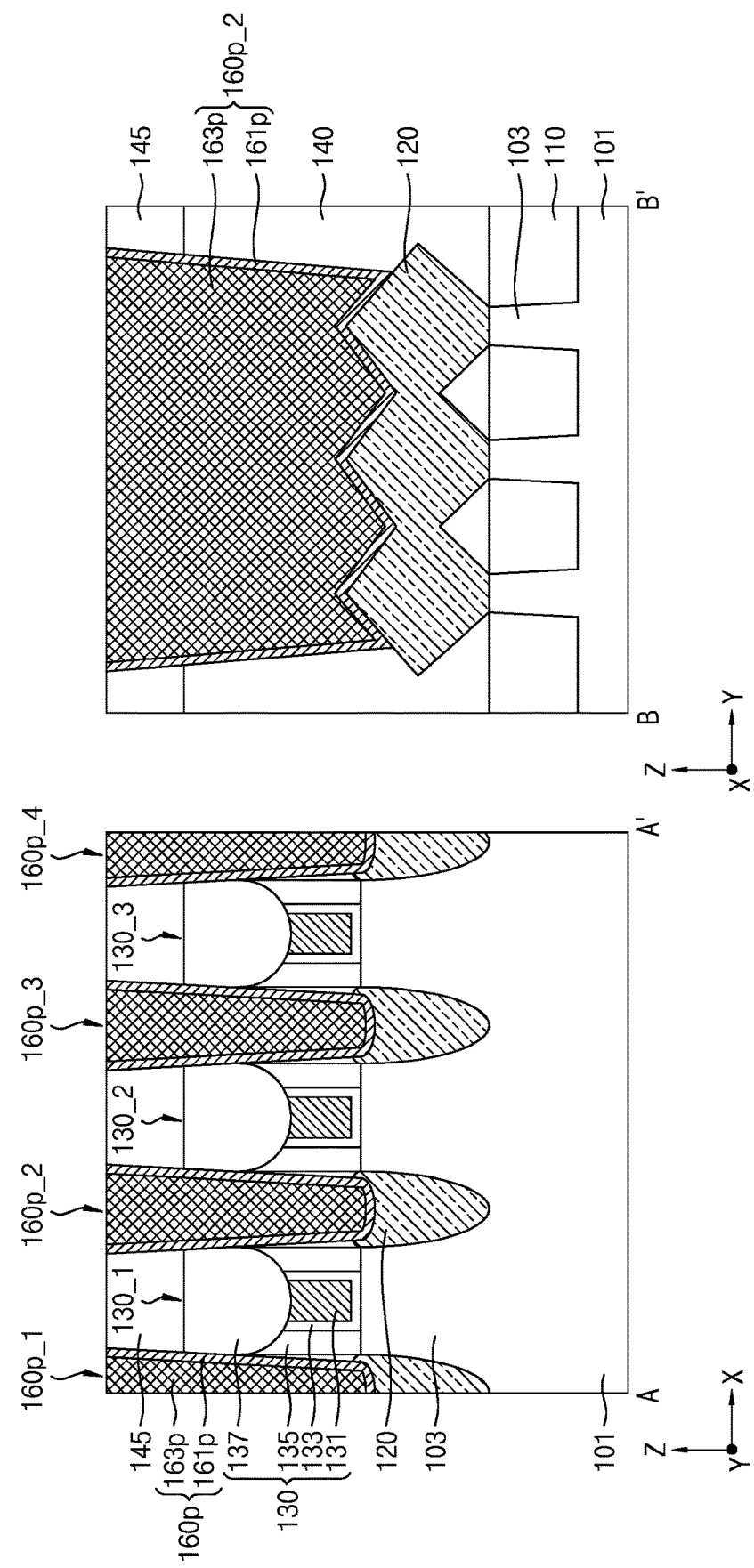

Referring to FIG. 14, upper portions of the preliminary barrier layer 161k and the buried conductive layer 163k may be partially removed through an etch-back process and/or a chemical mechanical polishing (CMP) process, thereby forming preliminary contact structures 160p. The preliminary barrier layer 161k and the buried conductive layer 163k may be removed until the first sacrificial interlayer insulating layer 145 is exposed. When the preliminary barrier layer 161k and the buried conductive layer 163k are removed, the first sacrificial interlayer insulating layer 145 may also be partially removed. Each of the preliminary contact structures 160p may include a preliminary barrier layer 161p and a preliminary contact plug 163p. The preliminary contact structures 160p may include first to fourth preliminary contact structures 160p_1, 160p_2, 160p_3, and 160p_4 sequentially disposed in the first horizontal direction. (e.g., the X direction). The first preliminary contact structure 160p_1 may be formed on one side of the first gate structure 130_1 (e.g., a side opposite to a side on which the second gate structure 130_2 is disposed with reference to the first gate structure 130_1). For example, the first preliminary, contact structure 160p_1 may be disposed adjacent to the first gate structure 130_1, and the first gate structure 130_1 may be disposed between the first preliminary contact structure 160p_1 and the second preliminary contact structure 160p_2. The second preliminary contact structure 160p_2 may be formed between the first gate structure 130_1 and the second gate structure 130_2, the third preliminary contact structure. 160p_3 may be formed between the second gate structure 130_2 and the third gate structure 130_3, and the fourth preliminary contact structure 160p_4 may be formed on one side of the third gate structure 130_3 (a side opposite to a side on which the second gate structure 1302 is disposed with reference to the third gate structure 130_3). For example, the fourth preliminary contact structure 160p_4 may be disposed adjacent to third first gate structure 130_3, and the third gate structure 130_3 may be disposed between the fourth preliminary contact structure 160p_4 and the third preliminary contact structure 160p_3. An upper surface of the preliminary contact structures 160p may be coplanar with an upper surface of the first sacrificial interlayer insulating layer 145.

Figure 15:
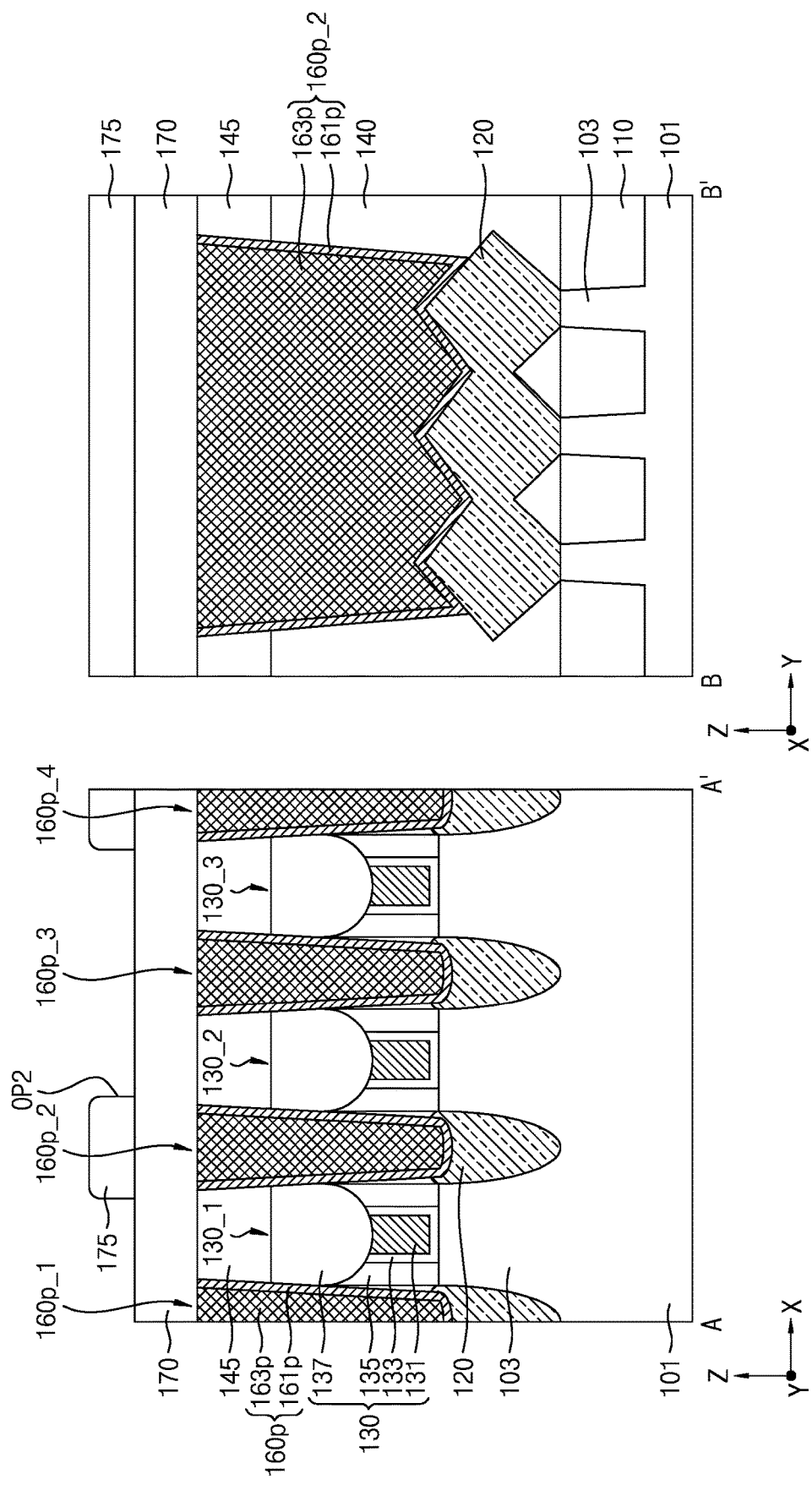
Figure 16:
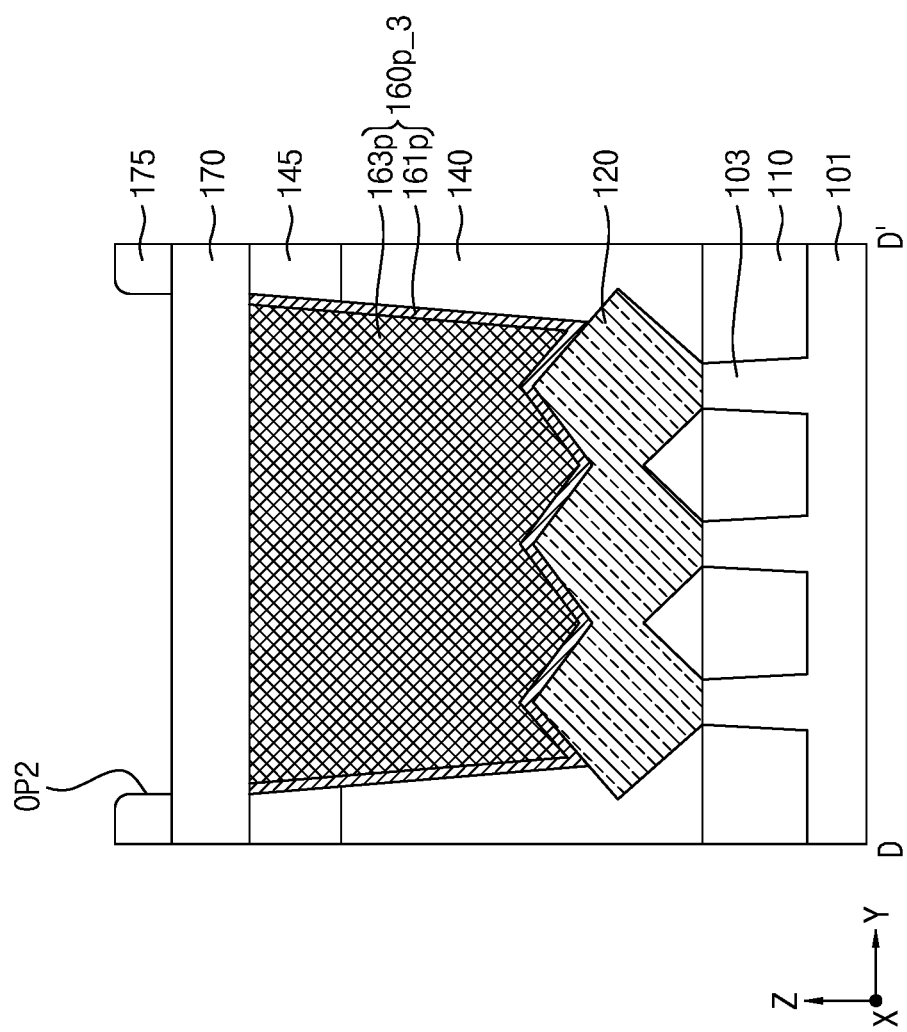

Referring to FIGS. 15 and 16, a second sacrificial interlayer insulating layer 170 may be formed on the first sacrificial interlayer insulating layer 145 and the preliminary contact structures 160p. The second sacrificial interlayer insulating layer 170 may completely cover the upper surface of the first sacrificial interlayer insulating layer 145 and the upper surface of the preliminary contact structures 160p. In at least one embodiment, the second sacrificial interlayer insulating layer 170 includes silicon oxycarbide (SiOC). The second sacrificial interlayer insulating layer 170 may prevent oxidation of the preliminary contact plug 163p.

Thereafter, a second mask pattern 175 may be formed on the second sacrificial interlayer insulating layer 170. The second mask pattern 175 may include a plurality of second openings OP2 exposing a portion of an upper surface of the second sacrificial interlayer insulating layer 170. The second mask pattern 175 may be formed on the second preliminary contact structure 160p_2, The second mask pattern 175 may be disposed on the fourth preliminary contact structure 160p_4. The second opening OP2 may vertically overlap the first preliminary contact structure 160p_1. The second opening OP2 may vertically overlap at least a portion of the first gate structure 130_1. The second opening OP2 may vertically overlap the third preliminary contact structure 160p_3. The second opening OP2 may vertically overlap at least a portion of each of the second gate structure 130_2 and the third gate structure 130_3. The second mask pattern 175 may include a material having etch selectivity with respect to the second sacrificial interlayer insulating layer 170. For example, the second mask pattern 175 may include silicon oxide.

Figure 17:
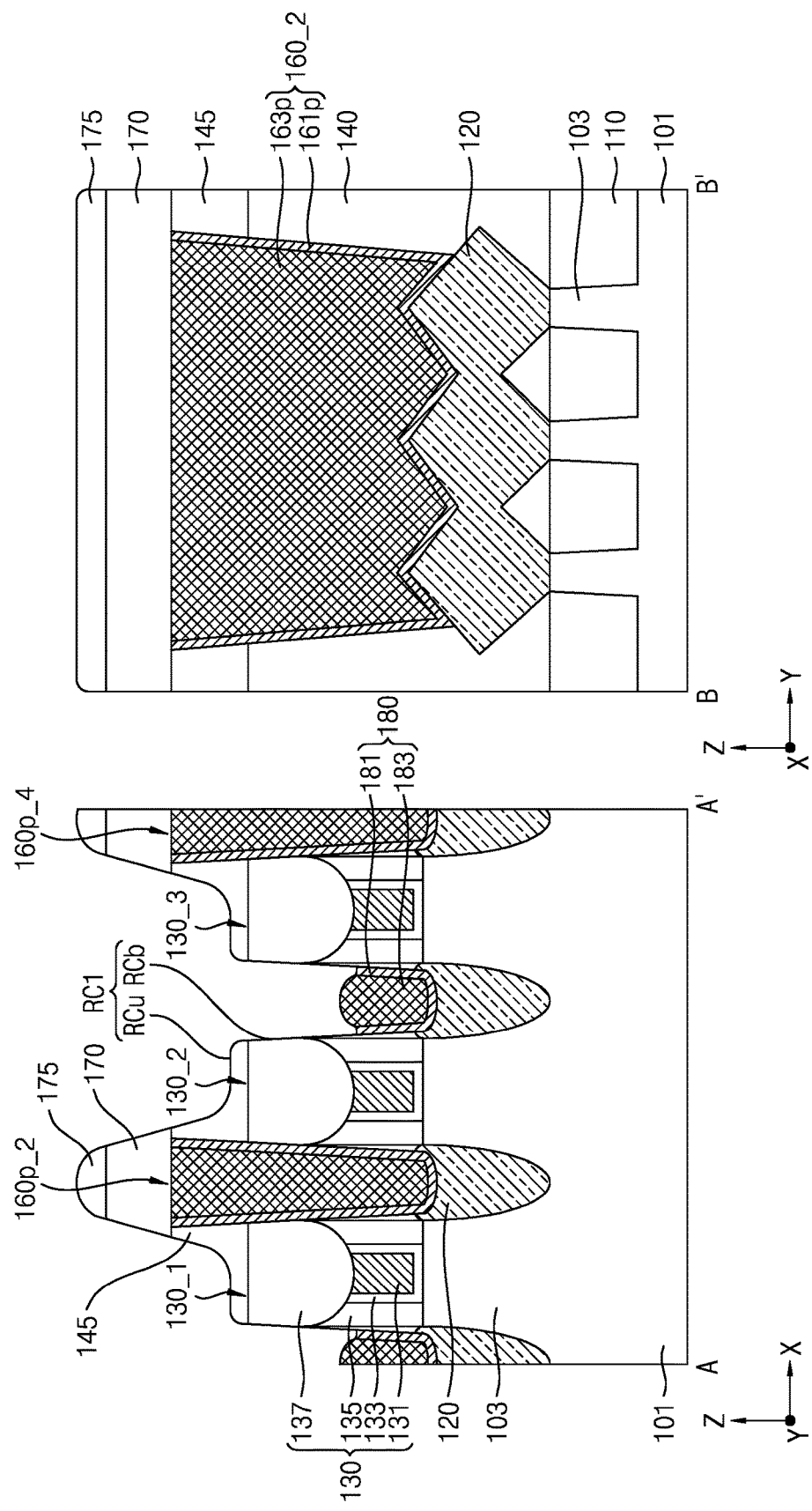
Figure 18:
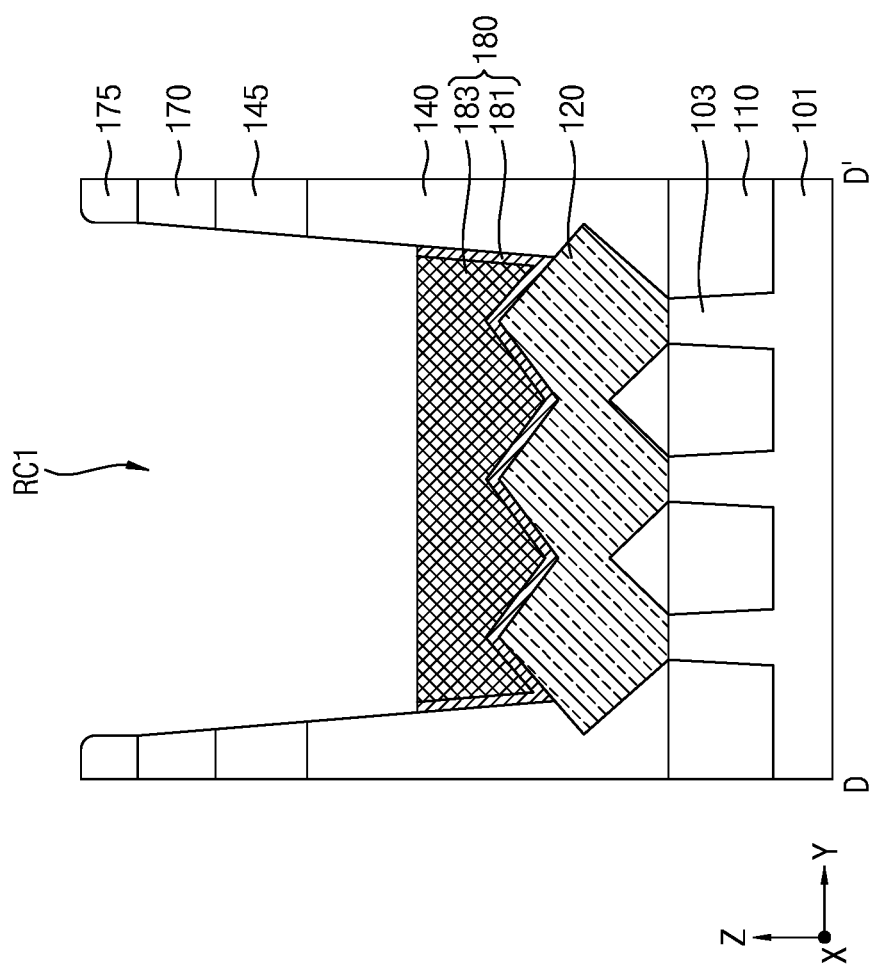

Referring to FIGS. 17 and 18, recesses RC1 may be formed through an etching process using the second mask pattern 175 as an etch mask. Each of the recesses RC1 may include an upper portion RCu and a lower portion RCb. The first sacrificial interlayer insulating layer 145 and the second sacrificial interlayer insulating layer 170 may be exposed by the upper portions RCu of the recesses RC1. The lower portions RCb of the recesses RC1 may downwardly extend from the upper portions RCu in the vertical direction (e.g., the Z direction), thereby exposing portions of side surfaces of the first preliminary contact structure 160p_1, the third preliminary contact structure 160p_3, and the gate structures 130. A width in the first horizontal direction (e.g., the X direction) of the upper portion RCu of each recess RC1 may be greater than a width in the first horizontal direction (e.g., the X direction) of the lower portion RCb of the recess RC1.

The etching process may first partially remove the second sacrificial interlayer insulating layer 170 and the first sacrificial interlayer insulating layer 145 through the second openings OP2 of the second mask pattern 175, thereby forming the upper portions RCu of the recesses RC1. As the upper portions RCu of the recesses RC1 are formed, the first preliminary contact structure 160p_1 and the third preliminary contact structure 160p_3 may be exposed. Upper portions of the first preliminary contact structure 160p_1 and the third preliminary contact structure 160p_3 may be partially removed by the etching process. A level of an upper end of each of the first preliminary contact structure 160p_1 and the third preliminary contact structure 160p_3 may become lower than a level of an upper end of each of the second preliminary contact structure 160p_2 and the fourth preliminary contact structure 160p_4.

Lower ends of the upper portions RCu of the recesses RC1 may be formed at a higher level than upper surfaces of the gate structures 130. In accordance with the formation of the upper portions RCu of the recesses RC1, the first sacrificial interlayer insulating layer 145 may cover the upper surfaces of the gate structures 130 without being completely removed. In the process of forming the recesses RC1, the first sacrificial interlayer insulating layer 145 may prevent the gate capping layer 137 of the gate structure 130 from being etched. As the gate capping layer 137 is prevented from being etched, the lower portion RCb of the recess RC1 may be subsequently formed in the etching process such that the lower portion RCb has a relatively small width. For example, a width of the lower portion RCb in the first horizontal direction (e.g., the X direction) may be smaller than a width of the upper portion RCu in the first horizontal direction.

Thereafter, the etching process may further remove portions of the first preliminary contact structure 160p_1 and the third preliminary contact structure 160p_3 exposed through the upper portions RCu of the recesses RC1, thereby forming the lower portions RCb of the recesses RC1 and the first source/drain contact 180. By the etching process, the upper portions RCu of the recesses RC1 may extend downwards in the vertical direction (e.g., the Z direction), and the lower portions RC1 of the recesses RC1 may therefore be formed among the gate structures 130. The level of an upper end of the first source/drain contact 180 may become lower in the vertical direction than the level of an upper end of the gate structure 130. In at least one embodiment, the etching process includes at least one of an anisotropic etching process or an isotropic etching process.

Figure 19:
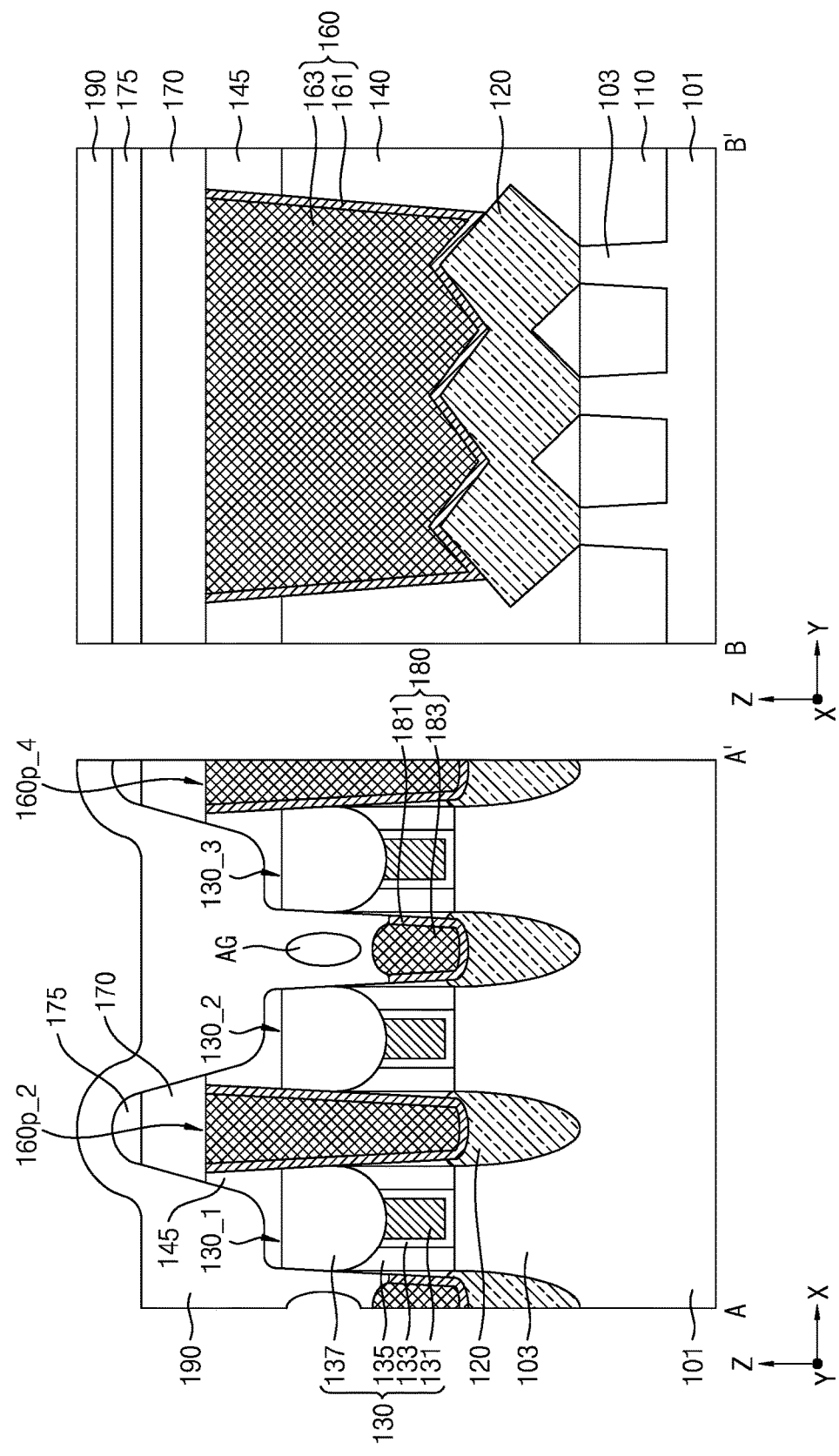
Figure 20:
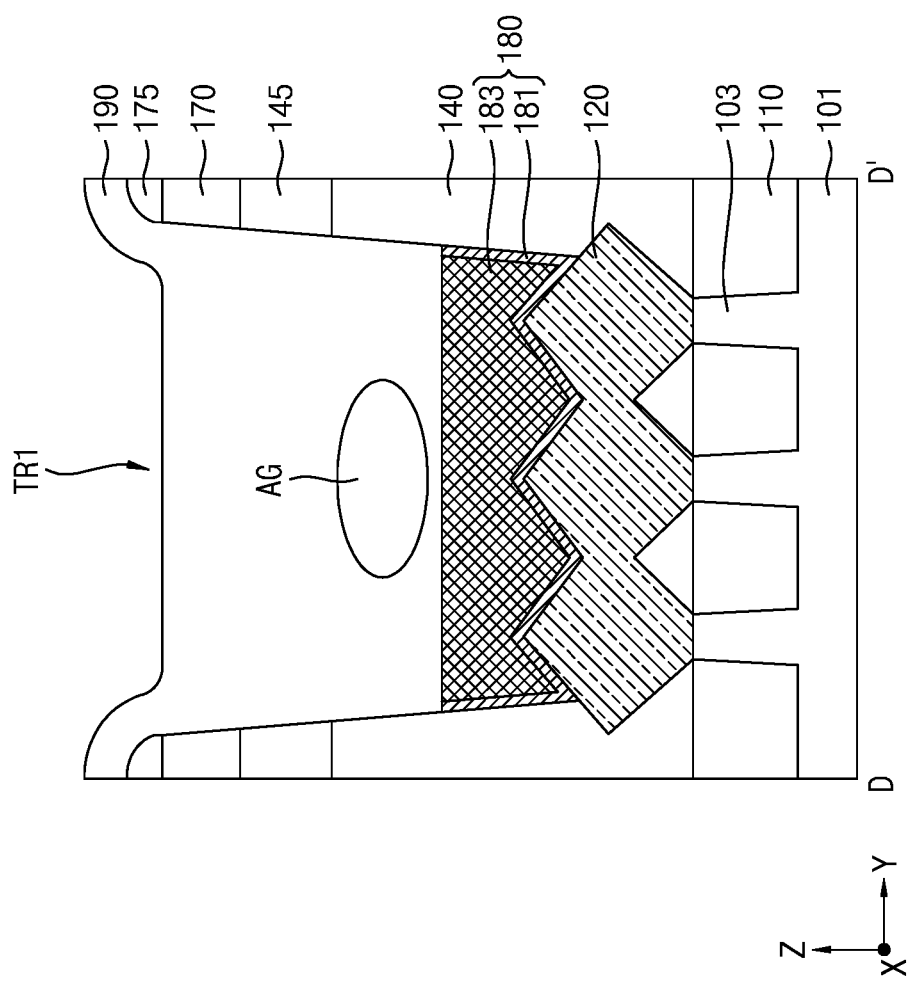

Referring to FIGS. 19 and 20, a preliminary contact insulating layer 190 may be formed in the recesses RC1. The preliminary contact insulating layer 190 may cover the first sacrificial interlayer insulating layer 145 and the second sacrificial interlayer insulating layer 170 exposed by the upper portions RCu of the recesses RC1, and may cover the second mask pattern 175. The preliminary contact insulating layer 190 may cover side surfaces of the gate structures 130 and an upper surface of the first source/drain contact 180 that are exposed by the lower portions RCb of the recesses RC1.

As the preliminary contact insulating layer 190 is formed, an air gap AG may be formed in the preliminary contact insulating layer 190. The air gap AG may be formed in the lower portions RCb of the recesses RC1. The air gap AG may be formed between the gate structures 130 on the first source/drain contact 180. The air gap AG may be a vacuum and have a permittivity of 1 or may be a space filled with air and have a permittivity of about 1. The air gap AG may be surrounded by the preliminary contact insulating layer 190. The air gap AG may be formed while the lower portions RCb of the recesses RC1 are formed such that a width in the first horizontal direction (e.g., the X direction) of the air gap AG is small. The air gap AG may be formed in accordance with step coverage characteristics and/or deposition process conditions. The preliminary contact insulating layer 190 may include the same material as the second sacrificial interlayer insulating layer 170. For example, the preliminary contact insulating layer 190 may include silicon oxycarbide (SiOC).

Figure 21:
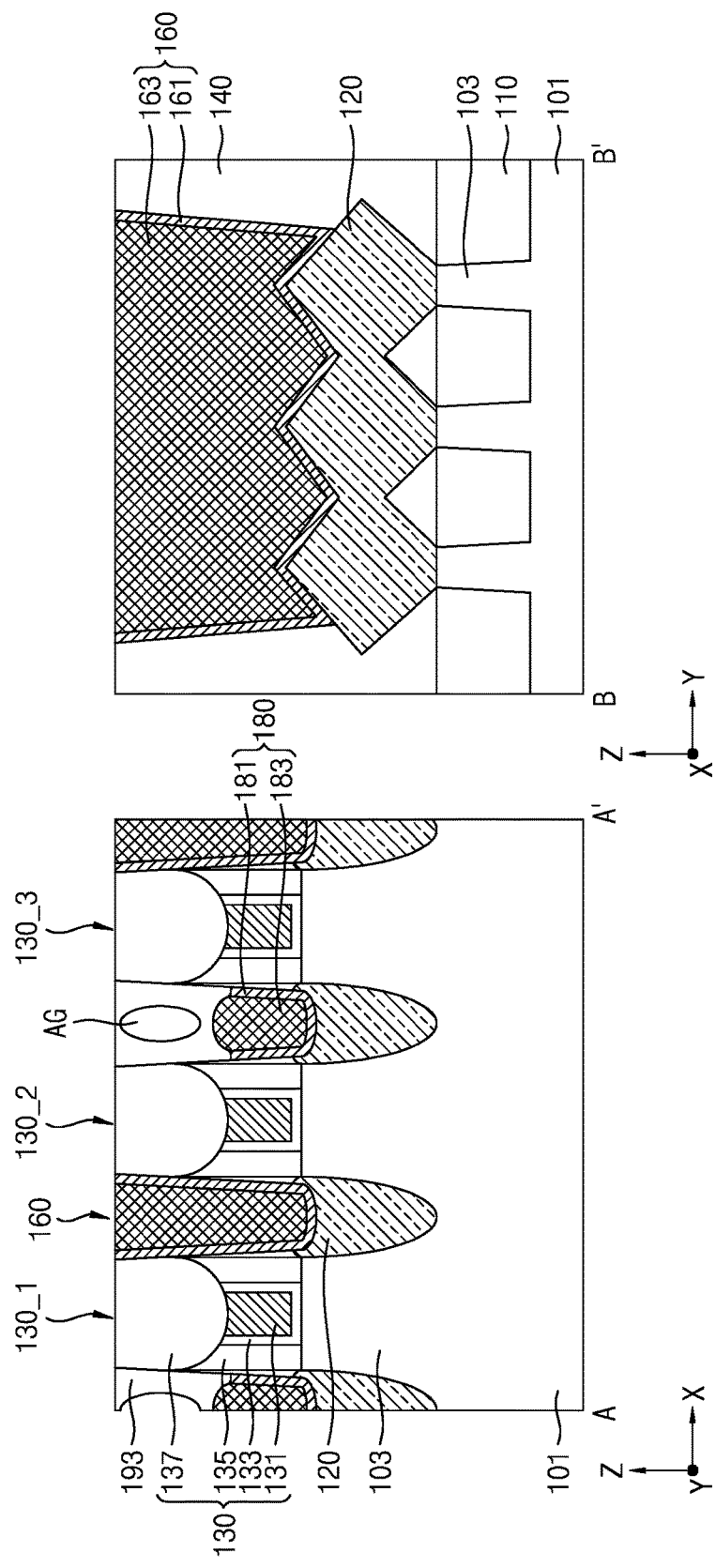
Figure 22:
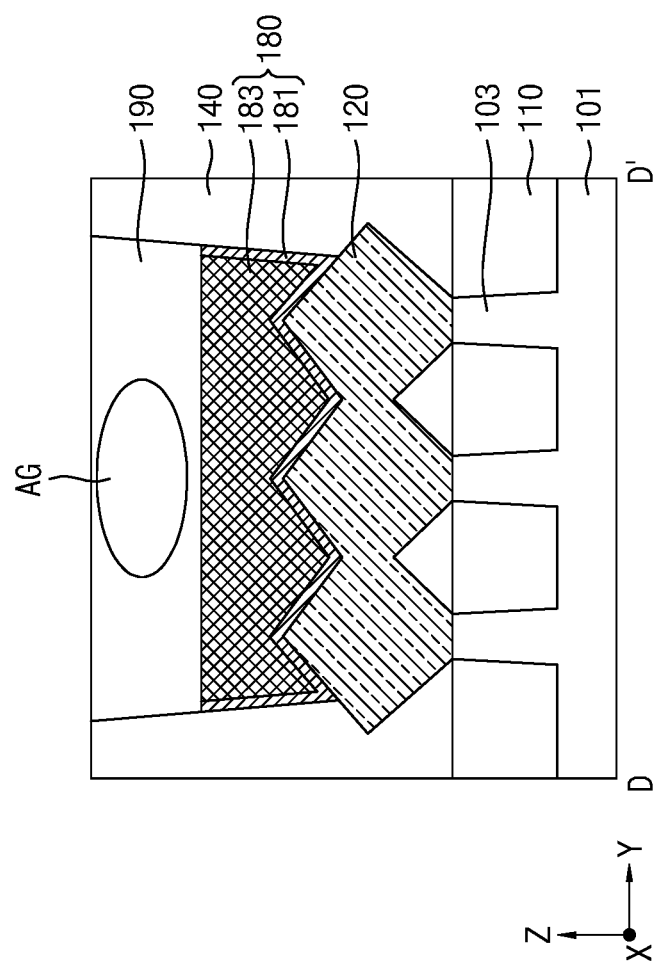

Referring to FIGS. 21 and 22, second source/drain contacts 160 may be formed through an etch-back process and/or a CMP process. Through the formation process of the second source/drain contacts 160, an upper portion of the preliminary contact insulating layer 190, the second mask pattern 175, the second sacrificial interlayer insulating layer 170, the first sacrificial interlayer insulating layer 145, an upper portion of the second preliminary contact structure 160p_2, and an upper portion of the fourth preliminary contact structure 160p_4 may be removed. Through the formation process of the second source/drain contacts 160, the upper surfaces of the gate structures 130 may be exposed.

As the upper portion of each of the second preliminary contact structure 160p_2 and the fourth preliminary contact structure 160p_4 are removed, the second source/drain contacts 160 may be formed. Upper surfaces of the second source/drain contacts 160 may be coplanar with the upper surfaces of the gate structures 130 and the upper surface of the interlayer insulating layer 140. As the upper portion of the preliminary contact insulating layer 190 is removed, a contact insulating layer 193 may be formed. An upper surface of the contact insulating layer 193 may be coplanar with the upper surfaces of the gate structures 130, the upper surfaces of the second source/drain contacts 160, and the upper surface of the interlayer insulating layer 140. In at least one embodiment, the air gap AG may be exposed as the upper portion of the preliminary contact insulating layer 190 is removed.

Again referring to FIGS. 2 to 5, an upper interlayer insulating layer 195 may be formed on the substrate 101. The upper interlayer insulating layer 195 may cover the upper surface of each of the gate structures 130, the contact insulating layer 193, the second source/drain contacts 160, and the interlayer insulating layer 140. In at least one embodiment, when the air gap AG is exposed, the upper interlayer insulating layer 195 may delineate an upper end of the air gap AG. For example, the upper end of the air gap AG may terminate at the upper insulating layer 195.

Subsequently, a gate contact. GC connected to the gate electrode 131 of the gate structure 130 may be formed. A first wiring structure 210 connected to the second source/drain contact 160 may be formed, and a second wiring structure 220 connected to the gate contact GC may be formed.

FIGS. 23 to 26 are cross-sectional views explaining a semiconductor device manufacturing method according to at least one embodiment of the present disclosure.

Figure 23:
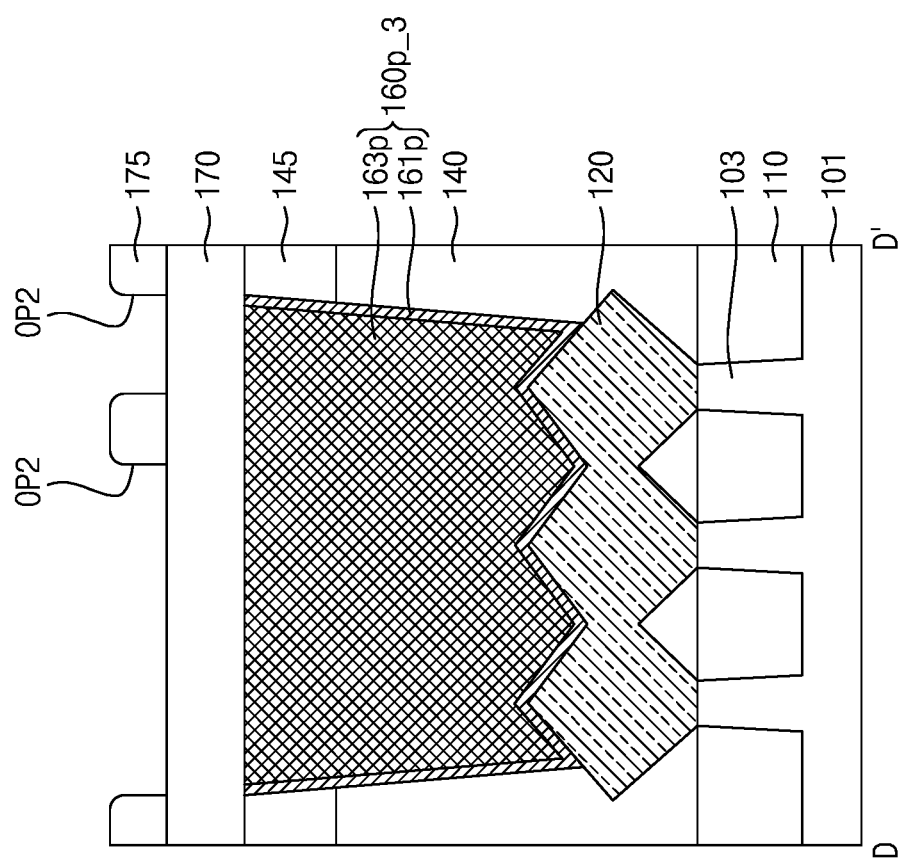
FIGS. 23 to 26 are cross-sectional views explaining a semiconductor device manufacturing method according to at least one embodiment of the present disclosure.

Referring to FIG. 23, when a second mask pattern 175 is formed on a second sacrificial interlayer insulating layer 170, a portion of the second mask pattern 175 may be disposed on a third preliminary contact structure 160p_3. The second mask pattern 175 may include a plurality of second openings OP2, and an upper surface of the second sacrificial interlayer insulating layer 170 may be exposed through the plurality of second openings OP2.

Figure 24:
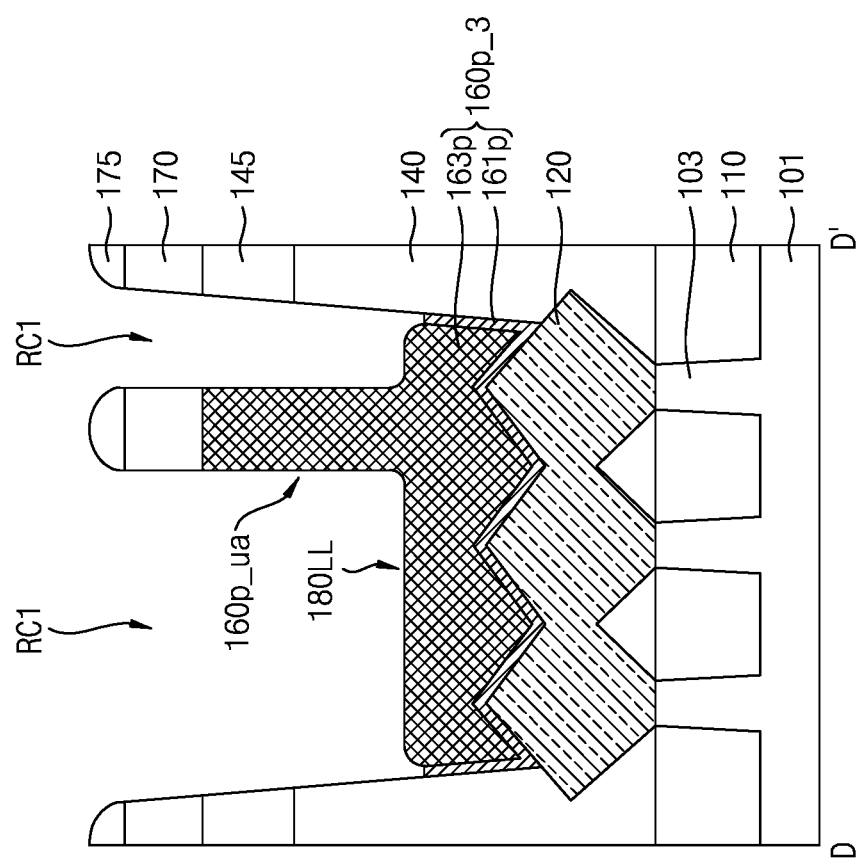

Referring to FIG. 24, recesses RC1 may be formed through an etching process using the second mask pattern 175 as an etch mask, By the etching process, a portion of each of the second sacrificial interlayer insulating layer 170, a first sacrificial interlayer insulating layer 145, and the third preliminary contact structure 160p_3 may be removed. As the portion of the third preliminary contact structure 160p_3 is removed, a lower contact 180LL and a preliminary upper contact 160p_ua may be formed. The preliminary upper contact 160p_ua may upwardly protrude from an upper surface of the lower contact 180LL in the vertical direction (e.g., the Z direction) away from the substrate 101. The preliminary upper contact 160p_ua may vertically overlap with the second mask pattern 175. The recesses RC1 may be formed on opposite sides of the preliminary upper contact 160p_ua. For example, the preliminary upper contact 160p_ua may be disposed between proximate pairs of the recesses RC1. In at least one embodiment, a recess RC1 may be formed on only one side of the preliminary upper contact 160p_ua, and one side surface of the preliminary upper contact 160p_ua may contact an interlayer insulating layer 140, the first sacrificial interlayer insulating layer 145, and the second sacrificial interlayer insulating layer 170.

Figure 25:
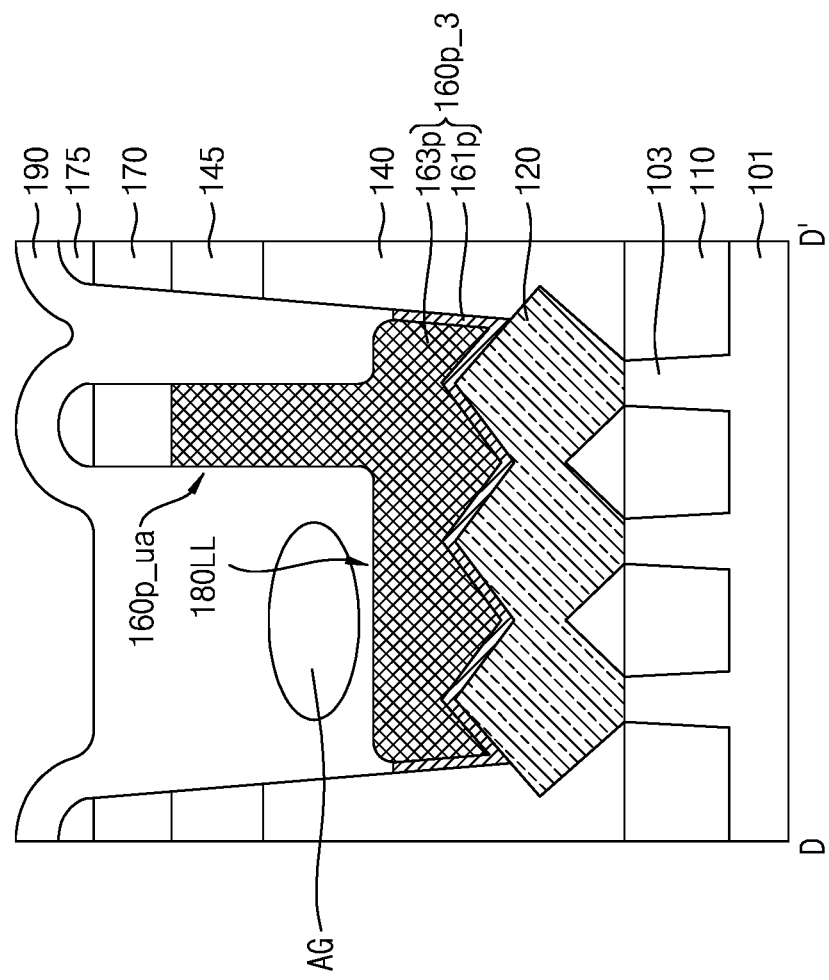

Referring to FIG. 25, a preliminary contact insulating layer 190 may be formed in the recesses RC1. The preliminary contact insulating layer 190 may cover the third preliminary contact structure 160p_3 exposed by the recesses RC1. The preliminary contact insulating layer 190 may cover surfaces of the lower contact 180LL and the preliminary upper contact 160p_ua, which are included in the third preliminary contact structure 160p_3. The preliminary contact insulating layer 190 may cover the first sacrificial interlayer insulating layer 145 and the second sacrificial interlayer insulating layer 170, which are exposed by the recesses RC1, and may cover the second mask pattern 175. As the preliminary contact insulating layer 190 is formed, an air gap AG may be formed in the preliminary contact insulating layer 190. The air gap AG may be formed on the lower contact 180LL. The air gap AG may be formed on one side of the preliminary upper contact 160p_ua. In at least one embodiment, the air gap AG may be formed on each of opposite sides of the preliminary upper contact 160p_ua. For example, the preliminary upper contact 160p_ua may be disposed between proximate pairs of air gaps AG.

Figure 26:
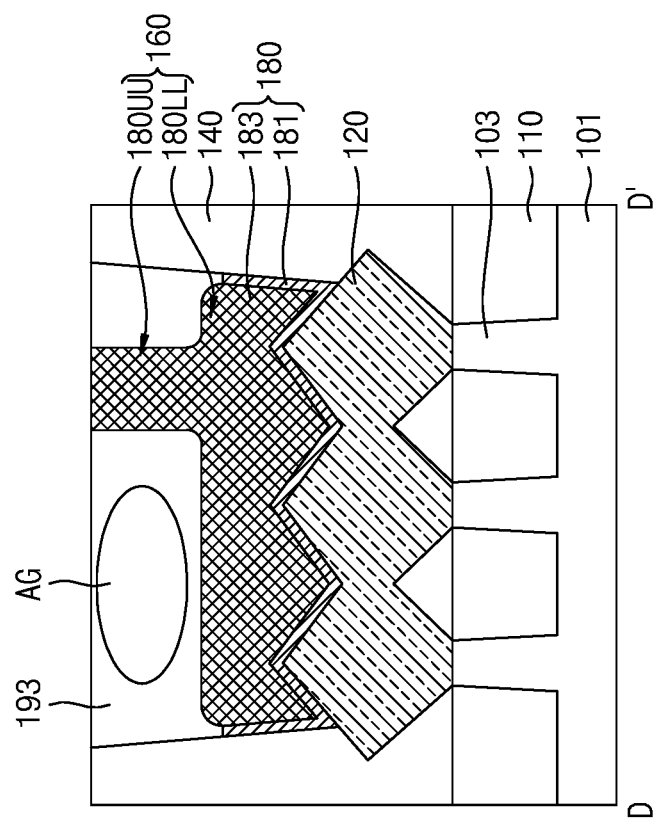

Referring to FIG. 26, a first source/drain contact 180 may be formed through at least one of an etch-back process or a CMP process. Through the formation process of the first source/drain contact 180, an upper portion of the preliminary contact insulating layer 190, the second mask pattern 175, the second sacrificial interlayer insulating layer 170, the first sacrificial interlayer insulating layer 145, and an upper portion of the third preliminary contact structure 160p_3 may be removed. Through the formation process of the first source/drain contact 180, an upper portion of the preliminary upper contact 160p_ua of the third preliminary contact structure 160p_3 may be partially removed, thereby forming an upper contact 180UU. As the upper contact 180UU is formed, the first source/drain contact 180, which includes the lower contact 180LL and the upper contact 180UU, may be formed. An upper surface of the upper contact 180UU, an upper surface of a contact insulating layer 193, and an upper surface of the interlayer insulating layer 140 may be coplanar.

Figure 27:
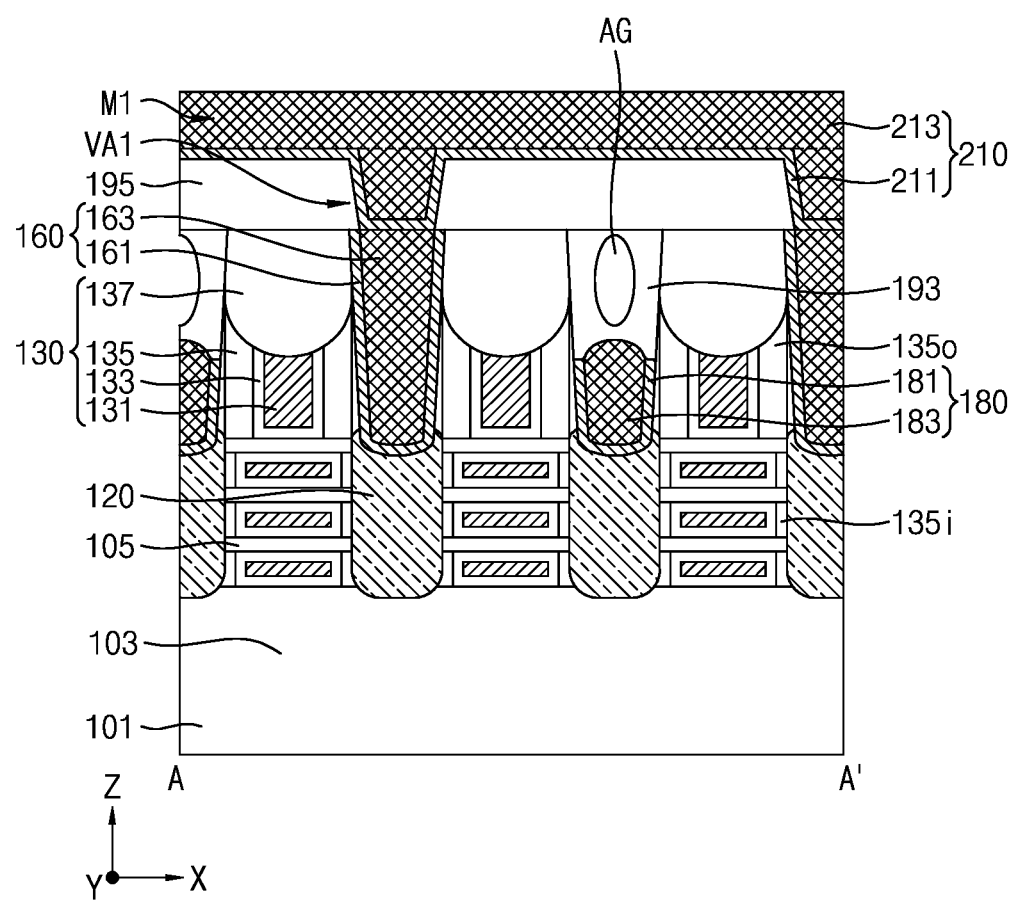
FIGS. 27 and 28 are cross-sectional views taken along lines A-A' and C-C' in FIG. 1 according to at least one embodiment of the present disclosure.
Figure 28:
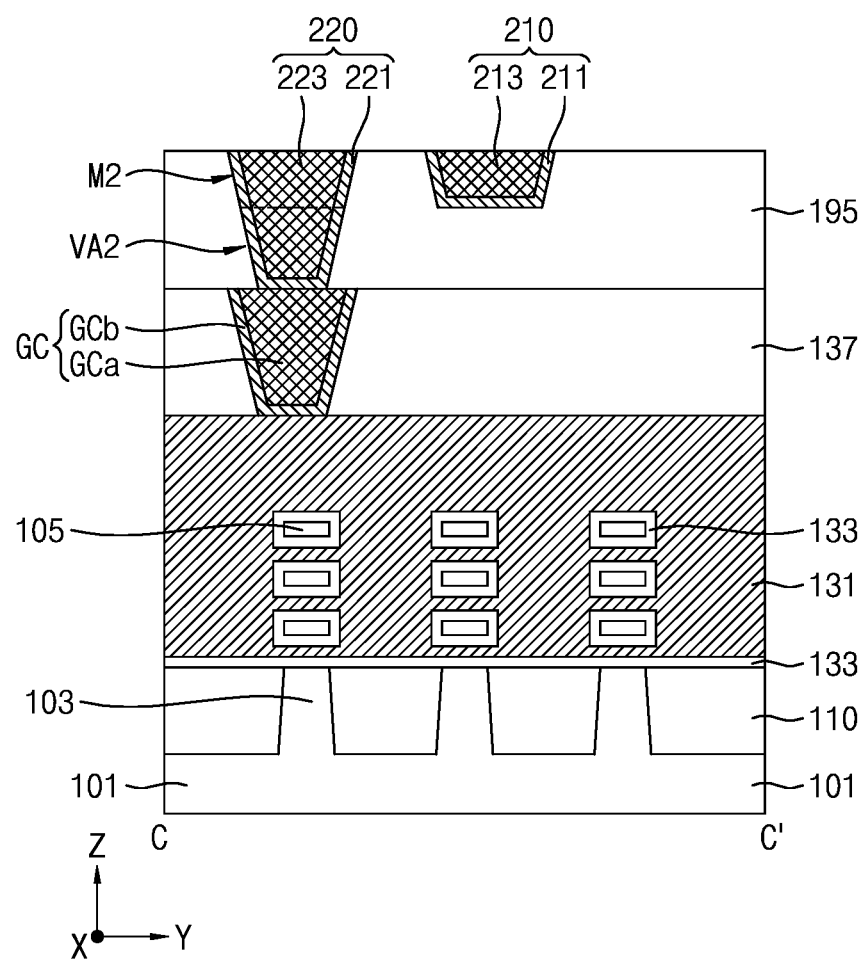

FIGS. 27 and 28 are cross-sectional views taken along lines A-A' and C-C' in FIG. 1 in accordance with an embodiment.

Referring to FIGS. 28 and 29, a semiconductor device may include a multi-bridge-channel transistor such as a multi-bridge channel FET, for example, MBCFET®. The semiconductor device may include channel patterns 105 disposed on an active pattern 103 and vertically spaced apart from one another. The active pattern 103 may protrude from an upper surface of a substrate 101, and may vertically overlap active patterns 103. In at least one embodiment, the active pattern 103 is omitted. In another embodiment, the semiconductor device includes only the channel patterns 105.

Each of the channel patterns 105 may have the form of a bar extending in a first horizontal direction (e.g., an X direction). The cross-sections of the channel patterns 105 are shown in FIG. 28 as having a rectangular shape. In at least one embodiment, the cross-sections of the channel patterns 105 have a circular shape or an oval shape. The channel patterns 105 may be surrounded by a gate insulating layer 133. The channel patterns 105 may be surrounded by a gate electrode 131. The channel patterns 105 may interconnect source/drain regions 120 that are adjacent to one another. The channel patterns 105 may include a group IV semiconductor such as Si, Ge, and Site, or may include a group III-V compound such as InGaAs, InAs, GaSb, InSb, etc.

The semiconductor device may include inner spacers 135i disposed among the channel patterns 105 (for example, between proximate pairs of the channel patterns 105) and between the channel pattern 105 and the active pattern 103. The inner spacers 135i may contact the source/drain region 120 at an outer side surface of the source/drain region 120. The semiconductor device may include one or more outer spacers 135o respectively disposed on the inner spacers 135i and the channel patterns 105. In at least one embodiment, the inner spacers 135i are omitted.

In accordance with at least one embodiment of the present disclosure, an air gap may be provided on a source/drain contact and, as such, possible generation of parasitic capacitance by gate contacts disposed adjacent to each other may be reduced.

While the inventive concept has been particularly shown and described with reference to embodiments thereof, it will be understood that various changes in form and details may be made therein without departing from the spirit and scope of the present disclosure.

What is claimed is:

1. A semiconductor device comprising:
 an active pattern extending on a substrate in a first direction;
 a gate structure extending on the active pattern in a second direction intersecting the first direction;
 a source/drain region disposed on at least one side of the gate structure;
 a source/drain contact connected to the source/drain region; and
 a contact insulating layer disposed on the source/drain contact, the contact insulating layer comprising at least one air gap,
 wherein the air gap is disposed on an upper surface of the source/drain contact to overlap with the upper surface of the source/drain contact in a direction perpendicular to the substrate.

2. The semiconductor device according to claim 1, wherein the contact insulating layer is spaced apart from the source/drain region.

3. The semiconductor device according to claim 1, wherein the contact insulating layer comprises silicon oxycarbonitride (SiOC).

4. The semiconductor device according to claim 1, wherein the source/drain contact comprises:
 a lower contact disposed on the source/drain region; and
 an upper contact upwardly protruding from the lower contact.

5. The semiconductor device according to claim 4, wherein:
 the air gap is disposed on the lower contact; and
 the air gap is disposed on one side of the upper contact.

6. The semiconductor device according to claim 1, wherein the contact insulating layer comprises:
 a base layer comprising the air gap; and
 a protrusion protruding from a bottom surface of the base layer toward the substrate.

7. The semiconductor device according to claim 6, wherein the protrusion includes a width in the first direction, and wherein the width in the first direction gradually decreases as the protrusion extends away from the base layer.

8. The semiconductor device according to claim 1, wherein the upper surface of the source/drain contact is convex toward the contact insulating layer.

9. The semiconductor device according to claim 1, wherein:
the source/drain contact comprises
a source/drain contact plug, and
a source/drain contact harrier layer covering a side surface and a bottom surface of the source/drain contact plug; and
an upper end of the source/drain contact plug is disposed at a higher level than an upper end of the source/drain contact barrier layer.

10. The semiconductor device according to claim 1, wherein:
the gate structure comprises
a gate electrode,
a gate insulating layer surrounding a sidewall and a bottom surface of the gate electrode, and
a gate capping layer disposed on the gate electrode and the gate insulating layer; and
a lower end of the air gap is disposed at a higher level than a lower end of the gate capping layer.

11. The semiconductor device according to claim 1, wherein an upper perimeter of the air gap is disposed at a same level as an upper surface of the contact insulating layer.

12. The semiconductor device according to claim 1, further comprising:
an upper interlayer insulating layer disposed on the gate structure and the contact insulating layer,
wherein an upper end of the air gap is immediately adjacent to the upper interlayer insulating layer.

13. The semiconductor device according to claim 12, wherein the upper interlayer insulating layer comprises an extension extending into the contact insulating layer.

14. The semiconductor device according to claim 1, further comprising:
an interlayer insulating layer contacting the source/drain region and the source/drain contact,
wherein the contact insulating layer contacts the interlayer insulating layer.

15. The semiconductor device according to claim 1, further comprising:
channel patterns disposed on the active pattern and vertically spaced apart from one another,
wherein the gate structure comprises a gate insulating layer and a gate electrode surrounding the channel patterns.

16. A semiconductor device comprising:
an active pattern extending on a substrate in a first direction;
an element isolation layer covering a lower portion of the active pattern;
a gate structure extending on the active pattern and the element isolation layer in a second direction intersecting the first direction;
source/drain regions disposed on opposite sides of the gate structure;
a first source/drain contact connected to the source/drain regions on a first side of the gate structure;
air interlayer insulating layer contacting the source/drain regions and the first source/drain contact; and
a contact insulating layer disposed on the first source/drain contact, the contact insulating layer comprising at least one air gap,
wherein the air gap is disposed on an upper surface of the first source/drain contact to overlap with the upper surface of the first source/drain contact in a direction perpendicular to the substrate.

17. The semiconductor device according to claim 16, further comprising:
a second source/drain contact connected to the source/drain regions on a second side of the gate structure,
wherein the second source/drain contact has a height different from a height of the first source/drain contact.

18. The semiconductor device according to claim 17, wherein an upper surface of the contact insulating layer is coplanar with an upper surface of the second source/drain contact.

19. The semiconductor device according to claim 16, wherein:
the first source/drain contact comprises
a lower contact on the source/drain region, and
an upper contact upwardly protruding from the lower contact; and
the air gap is disposed on each of opposite sides of the upper contact.

20. A semiconductor device comprising:
an active pattern extending on a substrate in a first direction;
an element isolation layer covering a lower portion of the active pattern;
a gate structure intersecting the first direction on the active pattern and the element isolation layer;
a gate contact connected to the gate structure;
a source/drain region disposed on at least one side of the gate structure;
a source/drain contact connected to the source/drain region on one side of the gate structure;
an interlayer insulating layer contacting the source/drain region and the source/drain contact;
a contact insulating layer disposed on the source/drain contact, the contact insulating layer comprising at least one air gap;
a first wiring structure connected to the source/drain contact; and
a second wiring structure connected to the gate contact,
wherein the air gap is disposed on an upper surface of the source/drain contact to overlap with the upper surface of the source/drain contact in a direction perpendicular to the substrate.

* * * * *